United States Patent
Kumakura et al.

(10) Patent No.: US 11,728,166 B2
(45) Date of Patent: Aug. 15, 2023

(54) SUBSTRATE PROCESSING METHOD AND SUBSTRATE PROCESSING APPARATUS

(71) Applicant: TOKYO ELECTRON LIMITED, Tokyo (JP)

(72) Inventors: Sho Kumakura, Miyagi (JP); Maju Tomura, Miyagi (JP); Yoshihide Kihara, Miyagi (JP); Hironari Sasagawa, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 463 days.

(21) Appl. No.: 16/803,377

(22) Filed: Feb. 27, 2020

(65) Prior Publication Data
US 2020/0279733 A1 Sep. 3, 2020

(30) Foreign Application Priority Data

Feb. 28, 2019 (JP) .................................. 2019-036709
Nov. 11, 2019 (JP) .................................. 2019-203958

(51) Int. Cl.
*H01L 21/033* (2006.01)
*H01J 37/32* (2006.01)
*H01L 21/311* (2006.01)
*H01L 21/02* (2006.01)

(52) U.S. Cl.
CPC ...... *H01L 21/0335* (2013.01); *H01J 37/3244* (2013.01); *H01L 21/02315* (2013.01); *H01L 21/31144* (2013.01); *H01J 2237/3321* (2013.01)

(58) Field of Classification Search
CPC .......... H01L 21/0335; H01L 21/02315; H01L 21/31144; H01L 21/3065; H01L 21/3081; H01J 37/3244

See application file for complete search history.

(56) References Cited

U.S. PATENT DOCUMENTS

| 6,284,666 B1* | 9/2001 | Naeem | H01L 21/3065 257/E21.232 |
| 2004/0097077 A1* | 5/2004 | Nallan | H01L 21/30655 438/689 |
| 2004/0256353 A1* | 12/2004 | Panda | H01J 37/32082 216/18 |
| 2016/0163561 A1* | 6/2016 | Hudson | H01J 37/32577 156/345.24 |
| 2016/0343580 A1 | 11/2016 | Hudson | |
| 2017/0178920 A1* | 6/2017 | Dole | H01J 37/32137 |
| 2018/0190503 A1 | 7/2018 | Wise et al. | |

FOREIGN PATENT DOCUMENTS

| JP | 2013-214584 A | 10/2013 |
| JP | 2016-136616 A | 7/2016 |
| JP | 2018-182310 A | 11/2018 |

* cited by examiner

*Primary Examiner* — Brook Kebede
(74) *Attorney, Agent, or Firm* — Weihrouch IP

(57) ABSTRACT

Provided is a method of processing a substrate including an etching target film and a mask having an opening formed on the etching target film. The method includes a) providing the substrate on a stage in a chamber and b) forming a film having a thickness that differs along a film thickness direction of the mask, on a side wall of the opening.

22 Claims, 19 Drawing Sheets

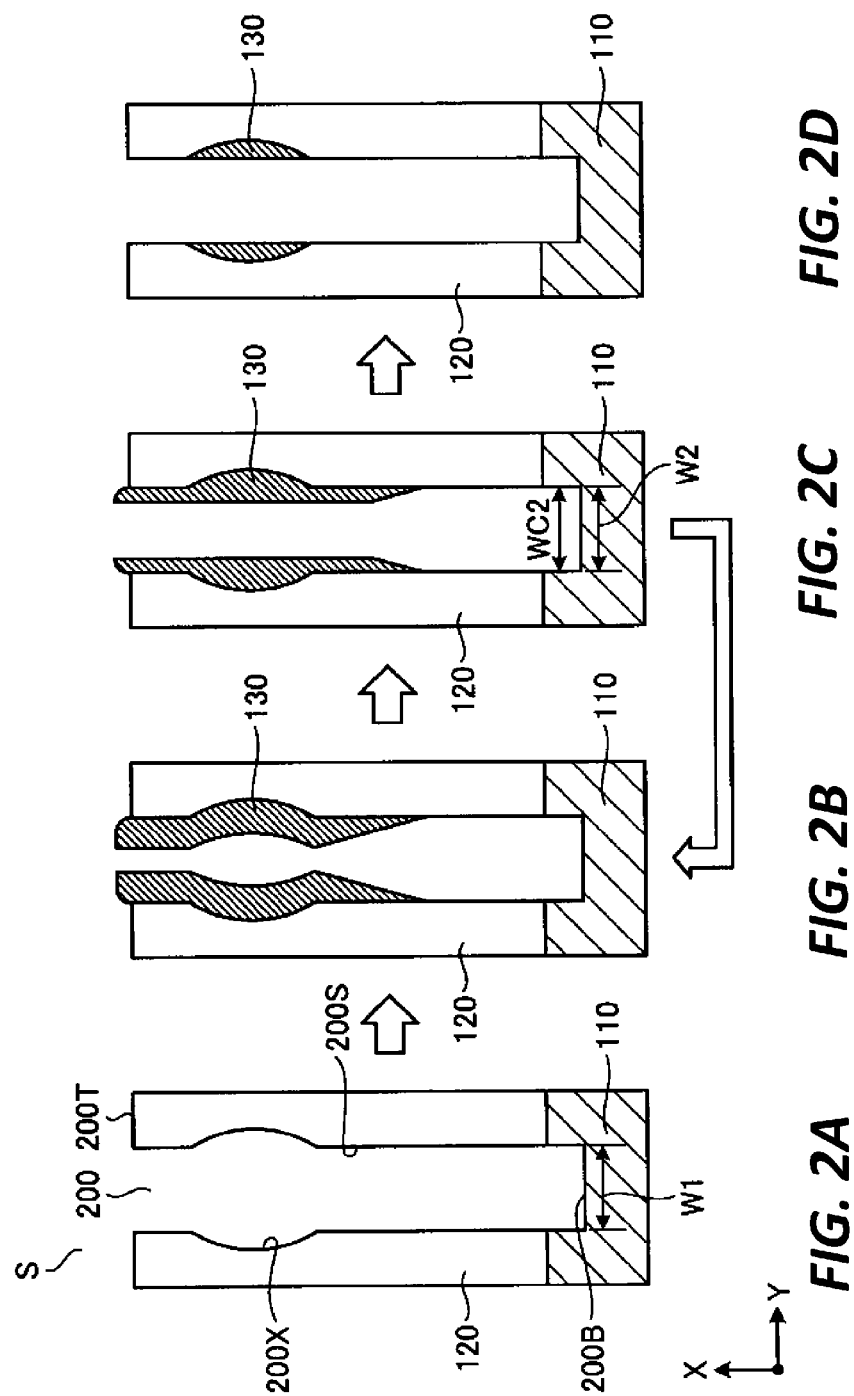

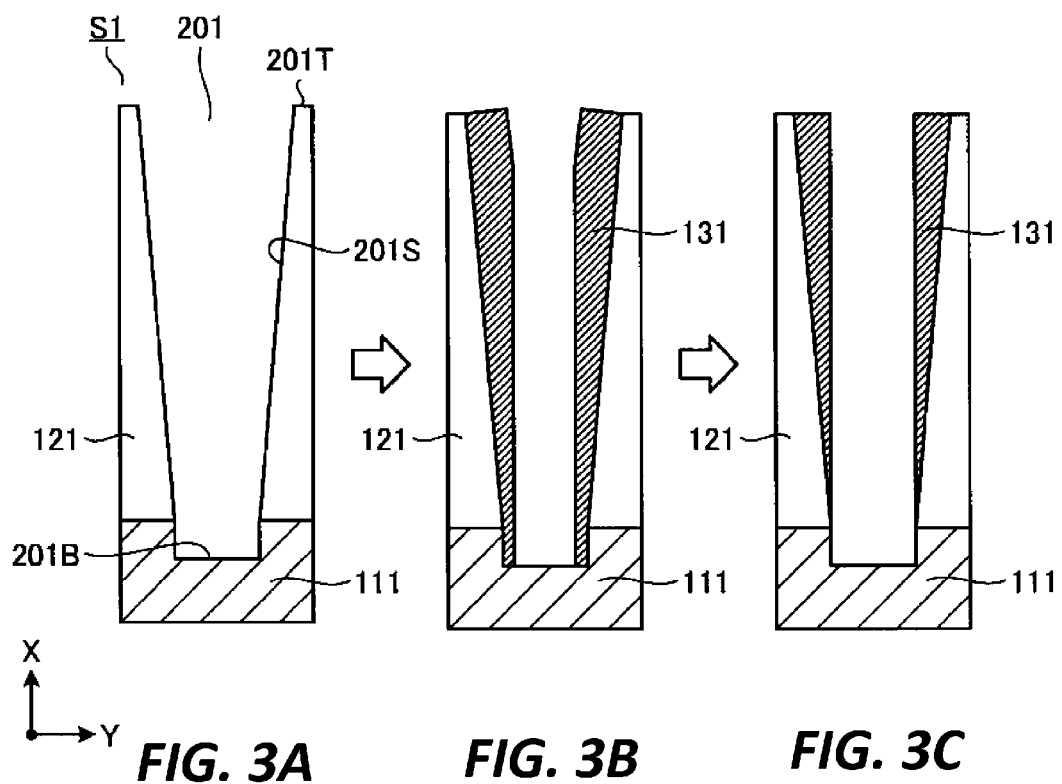

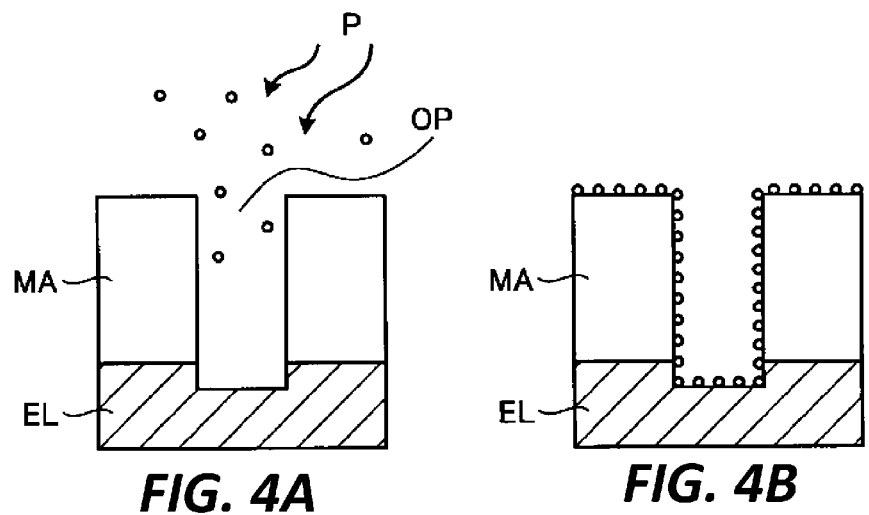
FIG. 4A    FIG. 4B
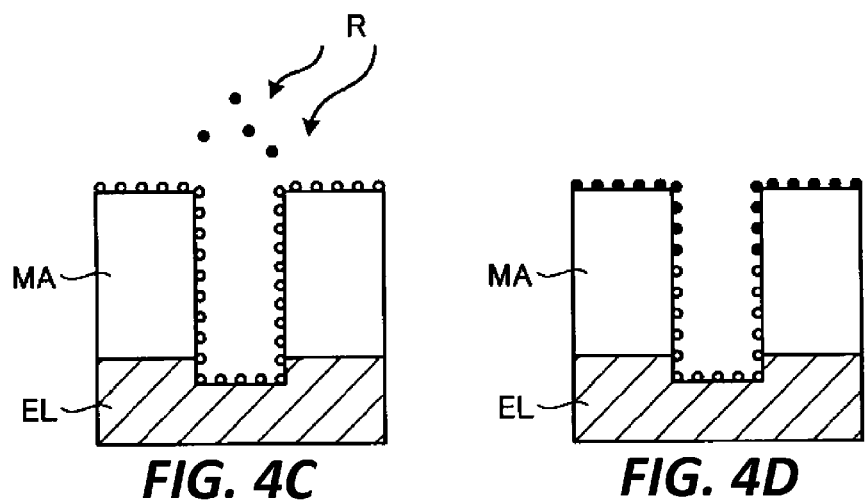
FIG. 4C    FIG. 4D

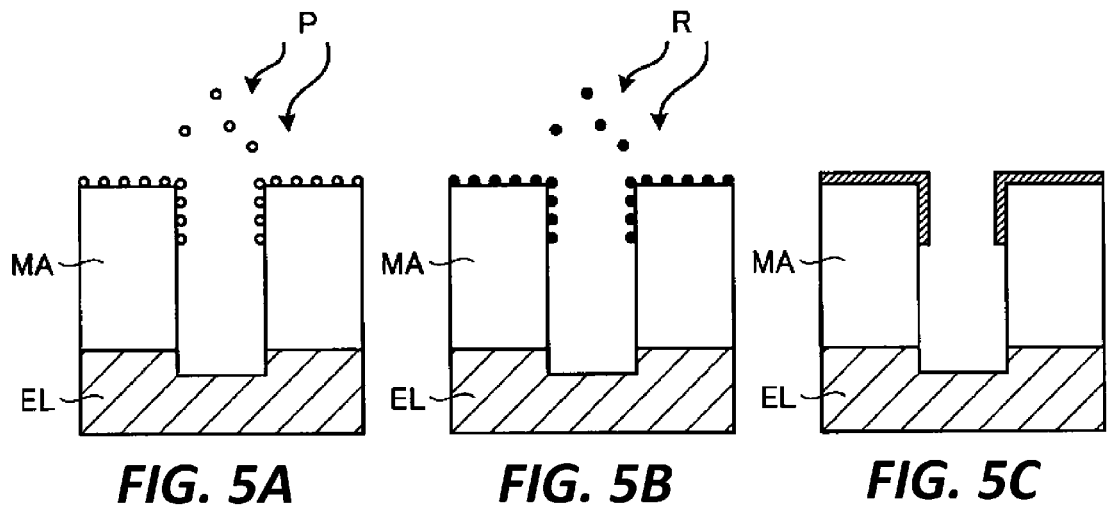
FIG. 5A  FIG. 5B  FIG. 5C
FIG. 6
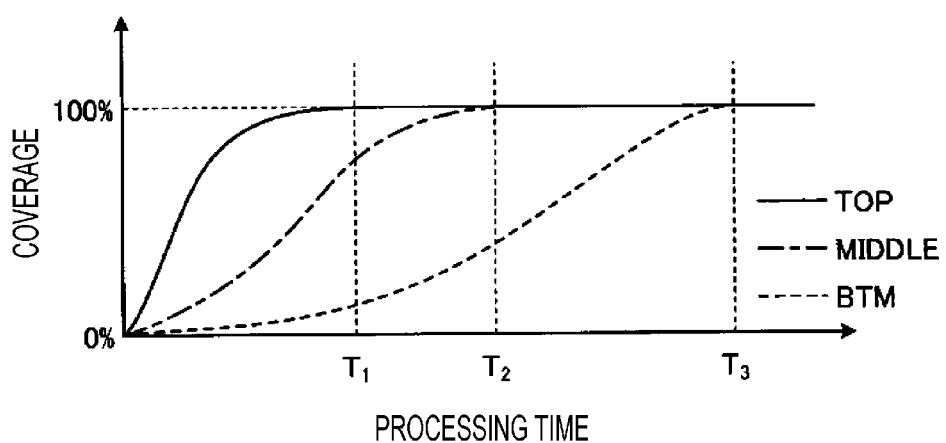

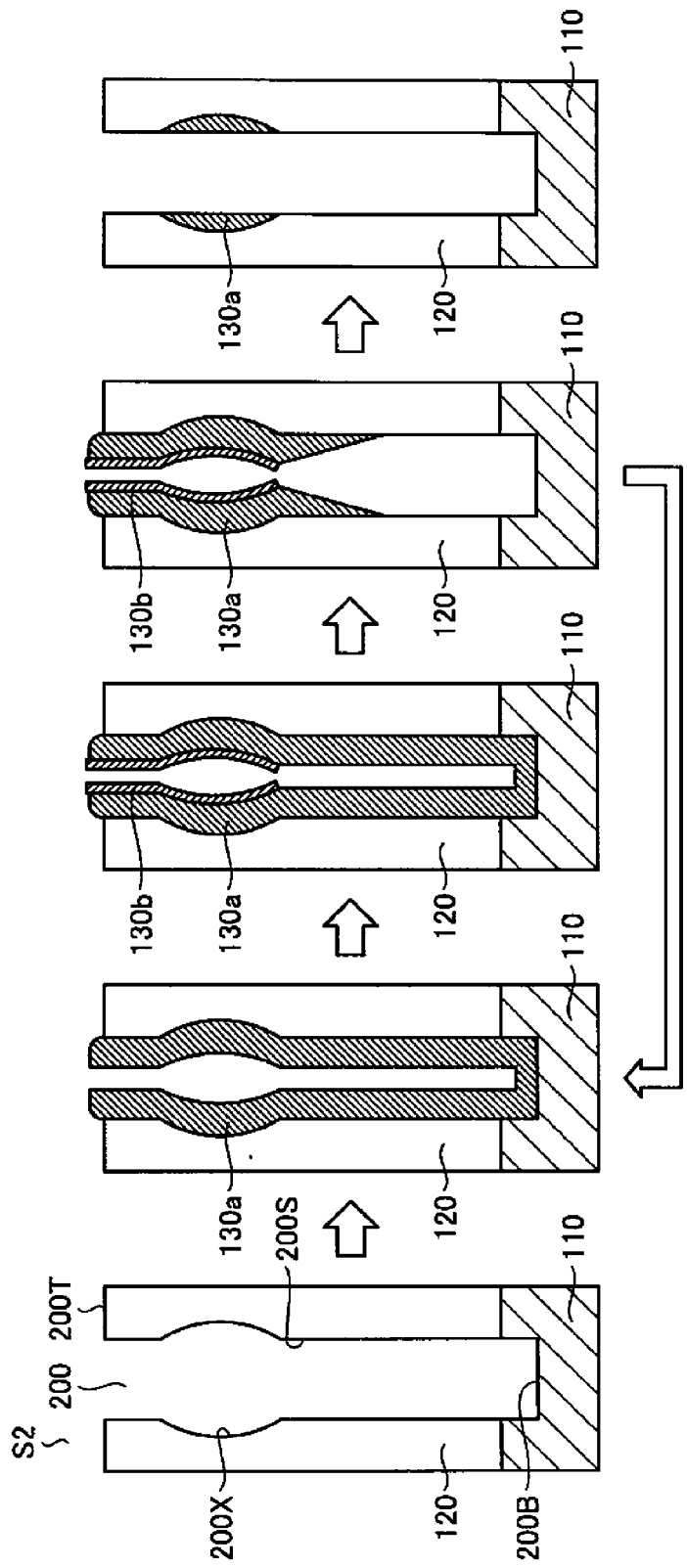

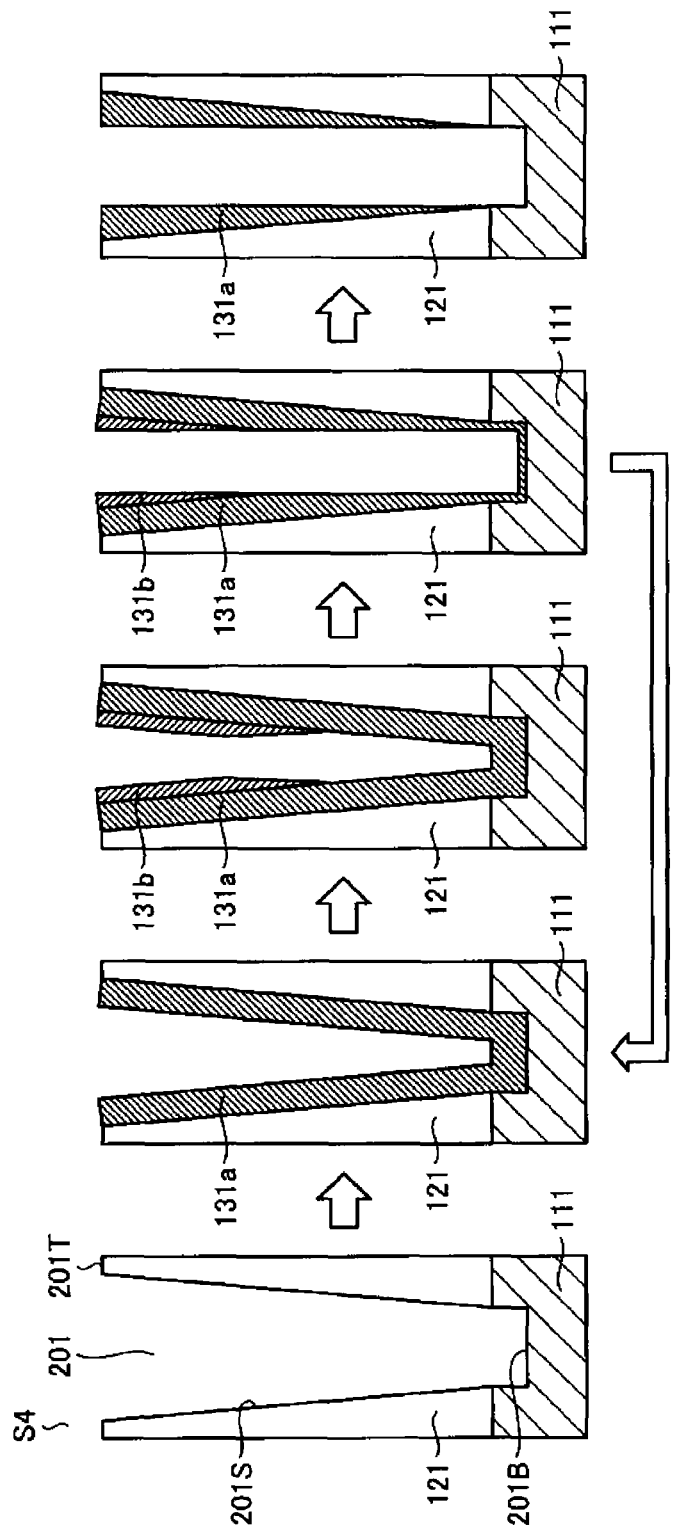

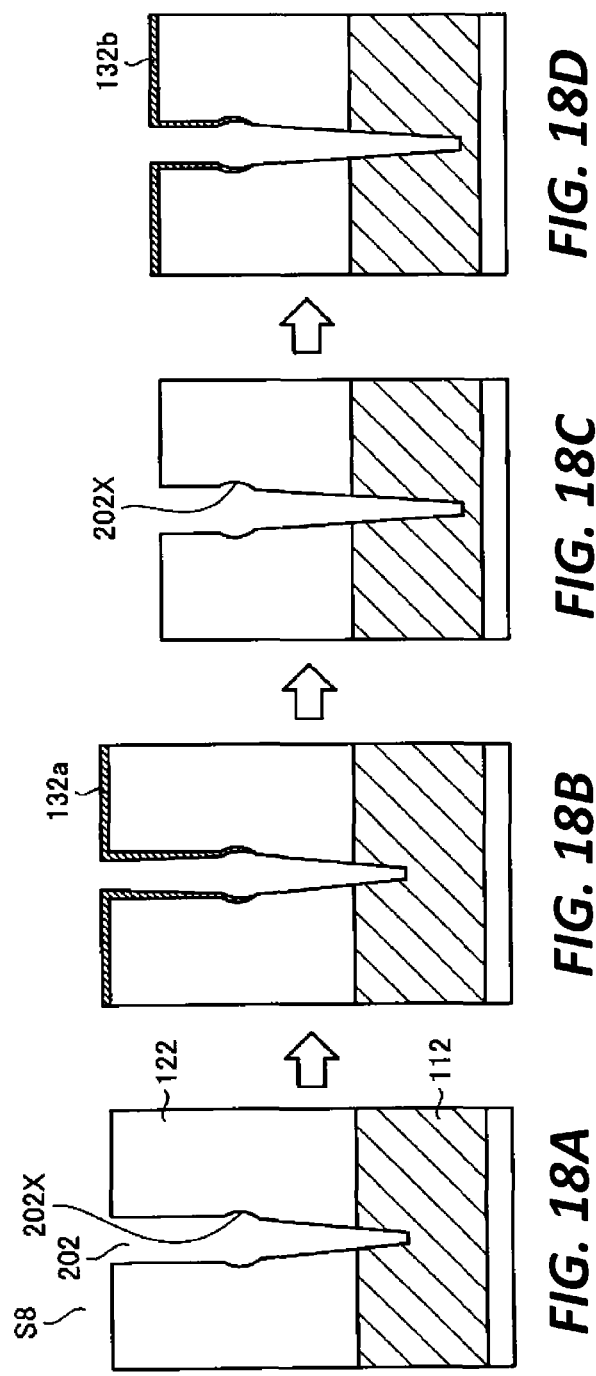

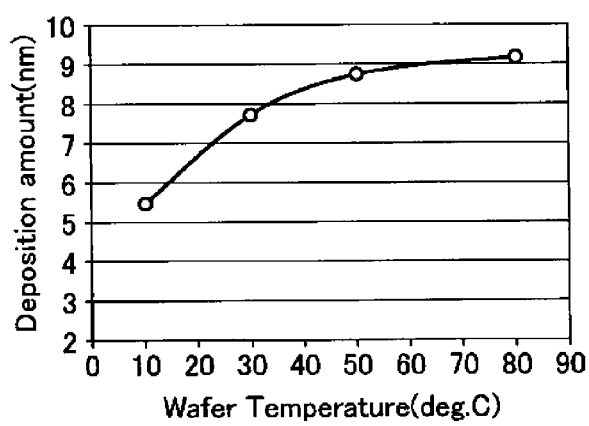
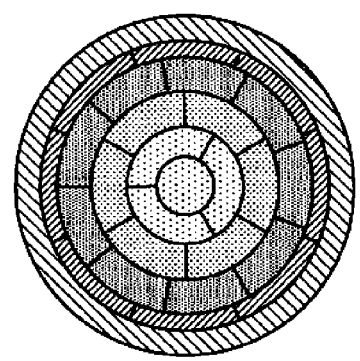
FIG. 19A                    FIG. 19B

SUBSTRATE PROCESSING METHOD AND SUBSTRATE PROCESSING APPARATUS

CROSS-REFERENCE TO RELATED APPLICATION

This application is based on and claims priority from Japanese Patent Application Nos. 2019-036709 and 2019-203958, filed on Feb. 28, 2019 and Nov. 11, 2019, respectively, the disclosures of which are incorporated herein in their entireties by reference.

TECHNICAL FIELD

The present disclosure relates to a substrate processing method and a substrate processing apparatus.

BACKGROUND

As the integration of semiconductor devices progresses not only in the horizontal direction but also in the vertical direction, the aspect ratio of a pattern formed in the manufacturing process of the semiconductor devices also increases. For example, in the manufacture of a 3D NAND, a channel hole is formed in a direction penetrating many metal wiring layers. In the case of forming memory cells of 64 layers, the aspect ratio of the channel hole is as high as 45.

Various methods have been proposed for forming a pattern having a high aspect ratio with high accuracy. For example, a technique has been proposed in which etching and film formation are repeatedly performed on an opening formed in a dielectric material of a semiconductor substrate to suppress etching in the lateral direction (U.S. Patent Application Publication No. 2016/0343580). In addition, a method of correcting the shape of a resist pattern formed by an EUV lithography by combining etching and film formation has been proposed (U.S. Patent Application Publication No. 2018/0190503).

SUMMARY

An aspect of the present disclosure provides a method of processing a substrate including an etching target film and a mask having an opening formed on the etching target film. The method includes step (a) and step (b). Step (a) is a step of providing the substrate on a stage in a chamber. Step (b) is a step of forming a film having a thickness that differs along the film thickness direction of the mask, on a side wall of the opening.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 2A to 2D are diagrams for explaining an example of a workpiece by the substrate processing method according to the first embodiment.

FIGS. 3A to 3C are diagrams for explaining another example of a workpiece by the substrate processing method according to the first embodiment.

FIGS. 4A to 4D are diagrams for explaining processing example 1 for forming a film according to an embodiment.

FIGS. 5A to 5C are diagrams for explaining processing example 2 for forming a film according to the embodiment.

FIG. 6 is a diagram for describing control of the coverage of a film formed by a sub-conformal ALD.

FIGS. 10A to 10E are diagrams for explaining an example of a workpiece by the substrate processing method according to the second embodiment.

FIGS. 11A to 11E are diagrams for explaining another example of a workpiece by the substrate processing method according to the second embodiment.

FIGS. 18A to 18D are diagrams for explaining the substrate processing method according to modification 1.

FIGS. 19A and 19B are diagrams for explaining a substrate processing method according to modification 2.

DETAILED DESCRIPTION

Figure 1:
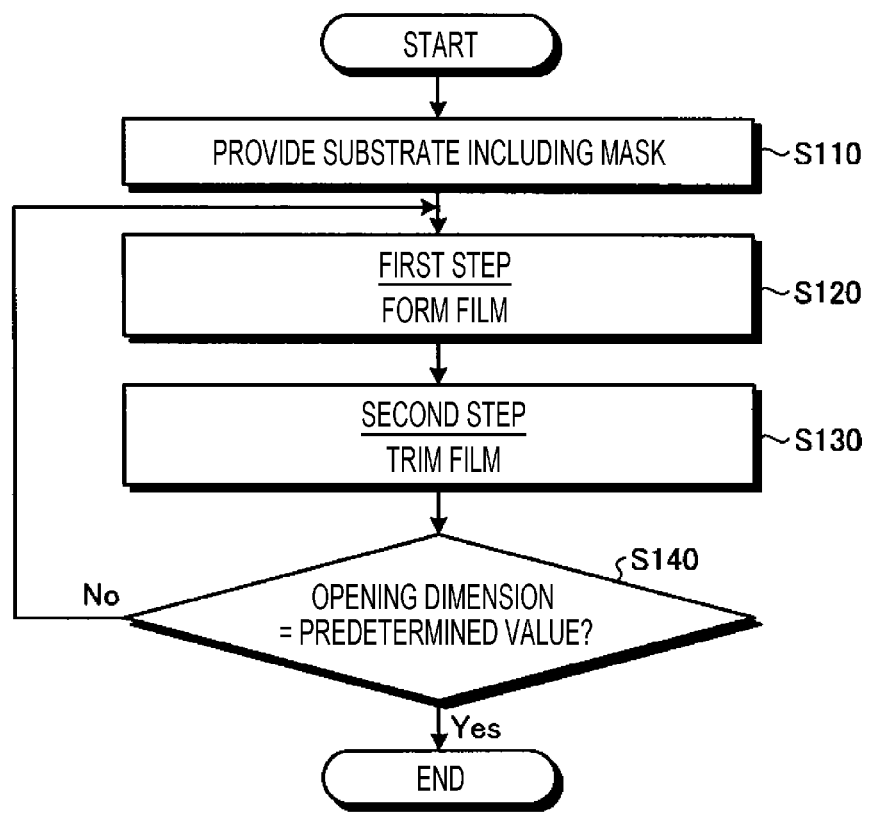
FIG. 1 is a flowchart illustrating an example of a flow of a substrate processing method according to a first embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the plasma processing apparatus disclosed herein will be described in detail with reference to the drawings. Further, the embodiments are not limiting. In addition, respective embodiments may be appropriately combined within a range that does not contradict the processing contents. Meanwhile, in the respective drawings, the same or corresponding parts are denoted by the same reference numerals.

In the following description, the term "pattern" refers to all shapes formed on a substrate. The pattern refers to a plurality of shapes formed on a substrate, such as holes, trenches, and lines and spaces. Further, the term "opening" refers to a portion of the pattern formed on the substrate that is recessed in the thickness direction of the substrate. In addition, the opening has a "side wall" that is an inner peripheral surface of the recessed shape, a "bottom" that is a bottom portion of the recessed shape, and a "top" that is continuous with the side wall and is a substrate surface near the side wall. Further, the lateral dimension at an arbitrary position in the space formed by the opening is referred to as an "opening dimension." The term "opening" is also used to refer to the entire space or any location in the space surrounded by the bottom and side wall of the recess.

First Embodiment

FIG. 1 is a flowchart illustrating an example of a flow of a substrate processing method according to a first embodiment. First, a substrate including a mask having an opening with a high aspect ratio is provided (step S110, hereinafter, also referred to as "step a"). Further, in the present embodiment, the phrase "opening with a high aspect ratio" refers to an opening having a depth to width ratio of at least 5 or more. Next, a film is formed on the inner peripheral surface of the opening (step S120, a first step; hereinafter, also referred to as "step b"). Next, the film is trimmed (step S130, a second step; hereinafter, also referred to as "step c"). Then, it is determined whether the opening dimension after trimming (e.g., critical dimension: CD) has reached a predetermined value (step S140). When it is determined that the value is the predetermined value ("Yes" in step S140,), the process ends. Meanwhile, when it is determined that the value is not the predetermined value ("No" in step S140), the process returns to step S120 to repeat the processes of steps S120 to S140.

Next, the substrate processing method according to the first embodiment will be further described with reference to FIGS. 2A to 2D. FIGS. 2A to 2D are diagrams for explaining an example of a workpiece by the substrate processing method according to the first embodiment. In FIGS. 2A to 2D, the X direction is the thickness direction of the substrate, and the Y direction is the width direction of the substrate surface.

A workpiece (substrate) S illustrated in FIGS. 2A to 2D includes an etching target film 110 formed thereon, and a mask 120. An opening 200 is formed in the mask 120. The opening 200 has a top 200T, a side wall 200S, and a bottom 200B. A recess 200X is formed in the side wall 200S of the opening 200. The opening 200 has a high aspect ratio (depth/diameter). For example, a depth to width ratio of the opening 200 is 5 or more, or 10 or more.

First, in step S110, the workpiece S illustrated in FIG. 2A is provided. Then, in step S120, as illustrated in FIG. 2B, a film 130 is formed on the inner peripheral surface of the opening. The film 130 has a film thickness that differs along the film thickness direction of the mask 120 (the X direction in FIGS. 2A to 2D). In the example of FIG. 2B, the film 130 has a film thickness that differs depending on a distance from the top 200T of the mask 120, and the film thickness gradually decreases on the bottom 200B. Further, the film 130 covers the recess 200X. The formation of the film 130 reduces the opening dimension of the opening 200 at the position of the recess 200X.

As a method of forming the film 130 having a film thickness that differs according to a distance from the top 200T of the mask 120, for example, a chemical vapor deposition (CVD) or an atomic layer deposition (ALD) may be used. A method of forming the film 130 having a different film thickness will be described later. Further, the film forming method in the first step is not limited to the above.

Next, in step S130, the film 130 is trimmed Here, the trimming refers to a process of removing a part of the surface of the film 130 formed in step S120 and arranging the thickness and shape of the film. The surface of the film 130 is removed by trimming and becomes smooth in the film thickness direction as illustrated in FIG. 2C. In FIG. 2C, the film 130 is formed in the recess 200X and the concave portion of the recess 200X is reduced as compared with the shape of the workpiece S in FIG. 2A. Thus, a difference among the opening dimension of the top 200T, the opening dimension of the recess 200X, and the opening dimension of the bottom 200B of the opening 200 before the first step decreases after the second step.

Further, as described above, in the first step, the film is formed from the top 200T to the bottom 200B under a processing condition in which the thickness of the film 130 becomes thinner. For this reason, a variation in the opening dimension of the bottom 200B before the first step and after the second step is suppressed. For example, an opening dimension W1 of the bottom 200B of the workpiece S in FIG. 2A is substantially the same as an opening dimension W2 of the bottom 200B of the workpiece S in FIG. 2C. Therefore, according to the first embodiment, it is possible to correct a shape abnormality that occurs at a predetermined position in the film thickness direction, such as bowing or necking, without changing the opening dimension of the bottom 200B of the opening 200.

After the second step, it is determined in step S140 whether the opening dimension of the opening 200 has reached a predetermined value. Here, the phrase "the opening dimension has reached a predetermined value" means that, for example, a difference among the opening dimension of the top 200T of the opening 200, a predetermined position of the side wall 200S (e.g., the opening dimension of the recess 200X), and the opening dimension of the bottom 200B falls within the predetermined value.

The determination as to whether the opening dimension has reached the predetermined value is performed based on, for example, the number of executions of the first step and the second step (the number of cycles). When the number of executions of the first step and the second step reaches a predetermined number, it is determined that the opening dimension has reached a predetermined value. When it is determined that the opening dimension has not reached the predetermined value, the first step (step S120) and the second step (step S130) are performed again. For example, when the shape of the workpiece S is in the state illustrated in FIG. 2D, it is determined that the opening dimension has reached the predetermined value, and the process is terminated.

Further, the film 130 may be formed of the same material as the mask 120. The mask 120 may be, for example, a carbon-containing film, a silicon-containing film, or a metal film. Control of the subsequent process becomes easier by making the film 130 and the mask 120 the same type of film. For example, the etching rates of the film 130 and the mask 120 may be made uniform during etching. Therefore, the dimension of the bottom 200B of the opening 200 may be easily controlled at the time of etching after the formation of the film 130. When the film 130 and the mask 120 are formed of the same type of film, the amount removed by etching may be easily controlled. For example, when the mask 120 is a carbon-containing film, the etching target film 110 is a silicon-containing film or a metal film. The carbon-containing film is, for example, an amorphous carbon layer (ACL). Further, the silicon-containing film may be, for example, a silicon-containing dielectric film, and may be a silicon oxide film (SiO), a silicon nitride film (SiN), a silicon oxynitride film (SiON), or a combination thereof. The metal film is a titanium (Ti) film or a tungsten (W) film. In addition, when the mask 120 is a silicon-containing film, the etching target film 110 is a carbon-containing film, a metal film, or a silicon-containing film having a composition different from that of the mask 120. Further, when the mask 120 is a metal film, the etching target film 110 is a silicon-containing film or a carbon-containing film. Also, the etching target film 110 may be a stacked film in which a plurality of layers is stacked. For example, the etching target film 110 may be a silicon oxide film/silicon nitride film (ONON film) or a silicon oxide film/polysilicon film (OPOP film).

Further, each of the first step and the second step may be continuously performed a plurality of times. For example, the second step may be executed once after the first step is executed five times. Further, the second step may be executed twice after the first step is executed 10 to 50 times.

FIGS. 3A to 3C are diagrams for explaining another example of a workpiece by the substrate processing method according to the first embodiment. A workpiece 51 illustrated in FIG. 3A has a mask 121 formed on an etching target film 111. The mask 121 has an opening 201 which is tapered from the top 201T to the bottom 201B. Also, in the case of the tapered opening 201, in the first step, a film 131 having a film thickness that differs along the stacking direction of the mask 121 is formed on the side wall 201S of the opening 201 (FIG. 3B). The shape of the inner peripheral surface of the opening 201 is corrected by the film 131, and the difference in the opening dimension in the stacking direction is reduced. Next, the film 131 is trimmed in the second step. Through the first step and the second step, the taper in the shape of the side wall 201S is mitigated. Therefore, as illustrated in FIG. 3C, by repeating the first step and the second step, a difference in the opening dimension among the top 201T, the side wall 201S, and the bottom 201B is reduced as compared with a difference in the opening dimension before the process. Therefore, by repeating the cycle including the first step and the second step, the dimensional difference of the opening in the film thickness direction may be reduced to correct the shape of the mask.

Example 1 of Film Formation Method—Sub-Conformal ALD

Next, a process of forming a film will be described. FIGS. 4A to 4D are diagrams for explaining processing example 1 for forming a film according to an embodiment. Further, FIGS. 5A to 5C are diagrams for explaining processing example 2 for forming a film according to the embodiment. In addition, the process illustrated in FIGS. 4A to 5C forms a film having a non-uniform film thickness using the same method as that of ALD. For this reason, the method illustrated in FIGS. 4A to 5C is hereinafter also referred to as a sub-conformal ALD.

Before describing the sub-conformal ALD, so-called ALD will be described. ALD typically involves four steps. First, in a first step, a first gas (also referred to as a precursor) is introduced into a chamber (processing container) in which a workpiece, for example, a semiconductor substrate is disposed. A first material included in the first gas is adsorbed on the surface of the workpiece. After the surface is covered with the first material, the chamber is evacuated (second step: purging). Next, a second gas including a second material that reacts with the first material (also referred to as a reactive gas) is introduced into the chamber. The second material reacts with the first material on the workpiece to form a film. The film formation ends when the reaction with the first material on the surface is completed. In ALD, when a predetermined material self-controllably adsorbs on and reacts with a substance present on the surface of a workpiece, a film is formed. For this reason, ALD usually implements a conformal film formation by providing a sufficient processing time.

In the sub-conformal ALD used in the present embodiment, processing conditions are set so that a self-controlled adsorption or reaction on the surface of the workpiece is not completed. There are at least the following two modes as processing modes.

(1) The precursor is adsorbed on the entire surface of the workpiece. Thereafter, the introduced reaction gas is controlled so as not to reach the entire surface of a precursor adsorbed on the workpiece.

(2) The precursor is adsorbed to only a part of the surface of the workpiece. Then, the introduced reaction gas is caused to react only with the precursor adsorbed on the surface of the workpiece.

In the substrate processing method according to an embodiment, a film whose film thickness decreases along the stacking direction is formed on the inner peripheral surface of the opening of the mask by using the method (1) or (2).

FIGS. 4A to 4D illustrate the above mode (1). A workpiece illustrated in FIGS. 4A to 4D includes a substrate (not illustrated), an etching target film 110 formed on the substrate, and a mask 120. An opening (OP) 200 is formed in the mask 120.

First, a precursor P is introduced into a chamber in which the workpiece is disposed (FIG. 4A). By providing a sufficient processing time for adsorption of the precursor P, the precursor P is adsorbed on the entire surface of the workpiece (FIG. 4B). When the adsorption of the precursor P is completed, the chamber is purged. Next, a reaction gas R is introduced into the chamber (FIG. 4C). The introduced reaction gas R reacts with the precursor P on the workpiece, and the film formation gradually proceeds from above a mask MA. Here, the reactive gas R is purged before the film reaches below the mask MA. By performing the process in this manner, it is possible to form a film on a part of inner peripheral surface of the opening of the mask MA (e.g., only on the upper portion thereof), not on the entire inner peripheral surface thereof using the ALD method (FIG. 4D).

FIGS. 5A to 5C illustrate the above mode (2). The workpiece illustrated in FIGS. 5A to 5C has the same shape as that of FIGS. 4A to 4D. In the example of FIGS. 5A to 5C, the precursor P is adsorbed only on the upper portion of the workpiece (FIG. 5A). For example, the precursor P is adsorbed by CVD. After purging the precursor P, the reaction gas R is introduced into the chamber (FIG. 5B). At this time, since the reaction gas R reacts and forms a film only at the position where the precursor P is adsorbed, the film is formed only on the upper portion of the workpiece (FIG. 5C).

(Processing Conditions for Position-Selective Film Formation)

As described above, in the sub-conformal ALD, the adsorption of the precursor in processing example 2 or the reaction of the reaction gas in processing example 1 is caused to occur only in a predetermined portion of the workpiece. For example, a film is formed only on the upper portion of the side wall of the opening. Processing parameters to be adjusted for position-selective film formation include, for example, the temperature of a stage on which a workpiece is disposed, the pressure in a chamber, the flow rate of a reaction gas to be introduced, the pressure, and the processing time. In the case of a process using plasma, the film formation position may also be adjusted by adjusting the value of radio frequency (RF) power applied for generating plasma.

FIG. 6 is a diagram for describing control of the coverage of a film formed by a sub-conformal ALD. In FIG. 6, the horizontal axis indicates the processing time, and the vertical axis indicates the coverage. Further, the solid line indicates the coverage at the top of the opening (TOP), the dashed line indicates the coverage at the center of the opening side wall (MIDDLE), and the broken line indicates the coverage at the bottom of the opening (BTM). FIG. 6 illustrates an approximate tendency and does not illustrate an exact numerical value.

As illustrated in FIG. 6, when a film is formed on the inner peripheral surface of the opening, the film formation (adsorption or reaction) speed is different at each of the top, the center of the side wall, and the bottom. The film formation proceeds gradually from the top where the precursor or the reaction gas first enters toward the bottom. First, as illustrated by the solid line in FIG. 6, the coverage gradually increases at the top, and film formation is completed first in each portion (timing $T_1$, coverage 100%). Next, as illustrated by the dashed line, the film formation proceeds at the center of the side wall slightly later than the top and is completed at a time ($T_2$) slightly later than the timing at which the film formation is completed at the top. Next, as illustrated by the broken line, the film formation at the bottom proceeds, and the film formation is completed at the latest timing $T_3$ of each portion.

Therefore, when the process of adsorbing the precursor or reacting the reaction gas is completed at a timing after the timing $T_1$ and before the timing $T_3$, the precursor is adsorbed or a film is formed on the top of the opening. However, the process may be terminated in a state where the adsorption or the formation of the film at the center of the side wall or the bottom has not been completed.

In FIG. 6, the coverage is plotted taking the processing time as a processing parameter on the horizontal axis. Instead, the processing time is fixed, and the coverage may also be adjusted by changing the temperature of the stage, the pressure in the chamber, the gas flow rate (dilution degree) of the precursor or the reaction gas, and the absolute value of the radio frequency power applied for plasma generation. For example, by setting the temperature of the stage to be low, the film formation below the opening may be delayed. Further, by setting the pressure in the chamber to be low, the film formation below the opening may be delayed. Also, by setting the flow rate of the precursor contained in the introduced gas to be low, the progress of the adsorption below the opening may be delayed. Also, the film formation below the opening may be delayed by setting the flow rate of the reaction gas to be introduced to be low. Further, when plasma is used, the film formation below the opening may be delayed by setting the absolute value of the radio frequency power applied for plasma generation to be low.

For example, each of the temperature of the stage, the pressure in the chamber, the degree of dilution of the gas (precursor) to be introduced, and the absolute value of the radio frequency power is set to a value lower than the value at which the adsorption of the precursor to the entire surface of the workpiece is completed, when the other processing conditions are the same. Further, for example, each of the temperature of the stage, the pressure in the chamber, the degree of dilution of the gas (reaction gas) to be introduced, and the absolute value of the radio frequency power is set to a value lower than the value at which the reaction of the reaction gas to the entire surface of the workpiece is completed, when the other processing conditions are the same.

By adjusting the processing conditions in this manner, in other words, by terminating the process in a state where the adsorption of the precursor as illustrated in processing example 2 or the reaction of the reaction gas as in processing example 1 is unsaturated, a film may be formed only above the pattern.

(Thickness of Film Formed by Sub-Conformal ALD)

Figure 7B:
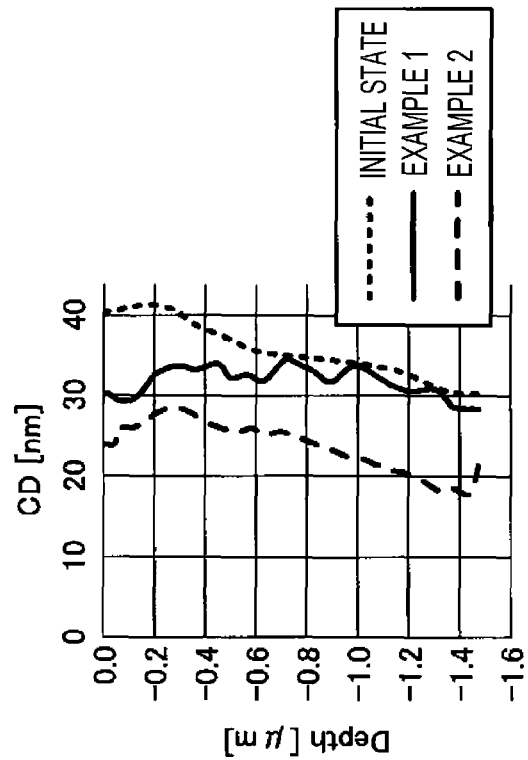
FIGS. 7A and 7B are diagrams for describing the thickness of a film formed by a sub-conformal ALD.
Figure 7A:
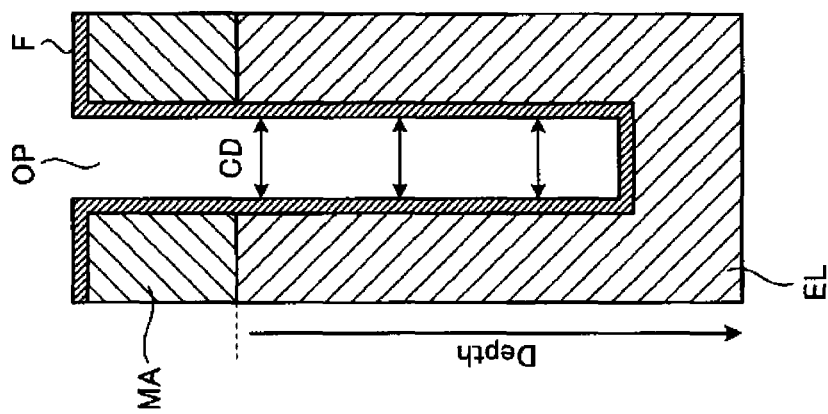

FIGS. 7A and 7B are diagrams for describing the thickness of a film formed by a sub-conformal ALD. The inventors have experimentally examined the thickness of a film formed by the sub-conformal ALD. FIG. 7A is a schematic view of the workpiece used in the experiment. The workpiece has an etching target film EL and a mask MA formed on a substrate. The mask MA has an opening OP. FIG. 7A illustrates a state in which the film F is formed on the entire inner surface of the opening OP. The symbol "CD" indicates the dimension of the opening OP.

FIG. 7B illustrates plotting the opening dimension in the initial state of the workpiece, the opening dimension after the process according to the first embodiment, and the opening dimension after the process according to Reference Example 1, respectively, in association with the depth from the surface of the etching target film EL. The initial state is a state before the film F is formed. Example 1 illustrates a state after a film is formed on the inner peripheral surface of the opening by the sub-conformal ALD. Specifically, the processing time in the reaction of the reaction gas is shortened (see timing $T_2$ in FIG. 6). Reference Example 1 refers to a state after a film is formed on the inner peripheral surface of the opening by an ordinary ALD. The ordinary ALD refers to an ALD in which a sufficient time is taken until each of the precursor and the reaction gas completes adsorption and reaction on the entire surface of the workpiece, and a conformal film formation is implemented.

As illustrated in FIG. 7B, first, in the initial state, the opening dimension is about 40 nanometers (nm) at a position having a depth of about 0.0 micrometers (μm), and is about 30 nm at a position having a depth of about 1.4 μm, and the opening dimension decreases as the depth increases. After performing the ordinary ALD (Reference Example 1), the film is formed with a substantially constant film thickness regardless of the depth. The opening dimension is about 25 nm at a position having a depth of about 0.0 μm, and the opening dimension is about 18 nm at a position having a depth of about 1.4 μm. A film having a thickness of about 12 to 15 nm is formed although there is a slight error depending on the depth. After the processing by the sub-conformal ALD (Example 1), the opening dimension is 30 nm at a position of about 0.0 μm depth, but is about 34 nm at a position of about 0.4 μm depth, and about 30 nm at a position of about 1.3 μm depth. That is, the thickness of the formed film gradually decreases from the top to the bottom of the opening. As described above, the thickness of the film formed by the sub-conformal ALD gradually changes from the upper portion to the lower portion of the opening. In other words, the sub-conformal ALD forms a so-called sub-conformal film instead of a conformal one while using the ALD method.

Figure 8:
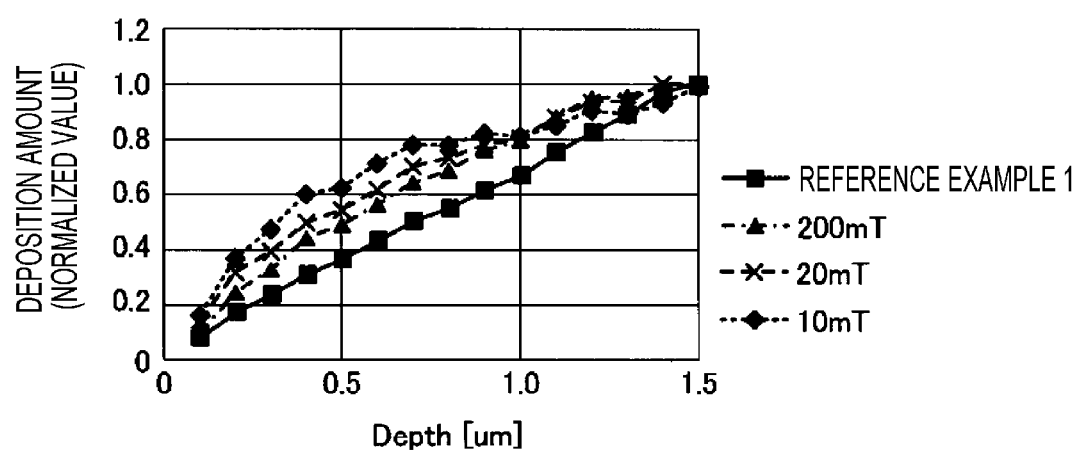
FIG. 8 is a diagram for explaining a relationship between the thickness of a film formed by the sub-conformal ALD and the pressure in a chamber.

FIG. 8 is a diagram for explaining a relationship between the distribution in the depth direction of the thickness of a film formed by the sub-conformal ALD and the pressure in a chamber. When the processing conditions other than the pressure are constant, since a total deposition amount of the deposited film greatly varies depending on the pressure, the difference in conditions is indicated by normalizing the total deposition amount obtained by integrating the thicknesses of the deposited films up to a depth of 1.5 μm to "1" and plotting the ratio of the deposition amount from a depth of 0 μm to a predetermined depth. Reference Example 1 in FIG. 8 is a case where a film is formed on a workpiece by the ordinary ALD. In the ordinary ALD, the film thickness is constant in the depth direction in order to achieve a conformal film formation. Therefore, a primary curve is drawn in the graph of FIG. 8. Further, among the processing conditions of Example 1 in FIG. 7B, a distribution in the film thickness is illustrated when the pressure in the processing chamber when the reaction of the reaction gas is performed is changed to 200 mTorr (mT), 20 mT, and 10 mT, respectively. As illustrated in FIG. 8, it may be seen that the total amount of the deposited film at the position where the depth is shallower than that in Reference Example 1 is larger at any pressure value. That is, it is indicated that a sub-conformal film is formed. In particular, it may be seen that when the pressure is 10 mT, the total amount of the deposited film at the position where the depth is shallow is large. In other words, it is advantageous to set the pressure in the chamber to be low in order to change the thickness of the film according to the depth and to increase the thickness near the top.

Further, the inventors set the reaction gas to an oxygen gas ($O_2$) and set the workpiece to a substrate having a pattern with an aspect ratio of about 10, and examined the change in the film thickness according to the dilution degree of the oxygen gas during the reaction of the reaction gas among the processing conditions of Example 1 in FIG. 7B. The degree of dilution of oxygen gas is the ratio of oxygen gas to the total flow rate of oxygen gas and dilution gas. The degree of dilution of oxygen gas may be replaced with the partial pressure of oxygen gas. The reaction gas was used by mixing $O_2$ and argon gas at a predetermined ratio. As a result, the film thickness fluctuated according to the depth of the opening of the pattern, and the film thickness fluctuation increased as the degree of dilution of $O_2$ increased. It is considered that this is because O radicals easily spread sufficiently at the bottom of the opening, and the amount of O radicals supplied to the bottom is suppressed by increasing the degree of dilution.

As described above, the sub-conformal ALD uses the ALD method and adjusts the processing conditions to form a self-controllable film having a coverage or film thickness that differs along the pattern depth direction.

Example 2 of Film Formation Method—Film Formation Process without Using Plasma

In another embodiment, the film may be formed by CVD or ALD without using plasma. Alternatively, a film may be formed by polymerization of an organic compound without using plasma. Next, descriptions will be made on an example in which a film is formed by a reaction of two types of processing gases without using plasma.

For example, a workpiece is first disposed in a chamber. A first organic film is formed on the surface of the workpiece. First, a first gas is supplied into the chamber. The first gas contains a first organic compound. The first organic compound is adsorbed on the first organic film on the surface of the workpiece. Next, the chamber is purged. For example, an inert gas such as a rare gas or a nitrogen gas is supplied into the chamber to remove the first organic compound excessively deposited on the surface of the workpiece. Next, a second gas is supplied into the chamber. The second gas contains a second organic compound. The second organic compound supplied to the surface of the workpiece is polymerized with the first organic compound, and a second organic film is formed on the surface of the workpiece. Then, after the formation of the second organic film, an inert gas such as a rare gas or a nitrogen gas is supplied into the chamber to remove the second organic compound excessively deposited on the surface of the workpiece.

Further, in the process of forming the second organic film, a region where the workpiece is disposed is heated in order to cause polymerization of the first organic compound and the second organic compound. For example, a region where the workpiece is disposed is heated to a temperature of 30° C. or more and 200° C. or less.

As described above, when a film is formed by polymerization between organic compounds, oxygen gas is not used. Therefore, the film formation may be implemented by suppressing damage to the workpiece, for example, oxidation. Such a process is suitable for film formation on a carbon-containing film such as an amorphous carbon layer (ACL).

In addition, the first organic compound and the second organic compound used in the film forming process are, for example, isocyanate and amine. Further, the first organic compound and the second organic compound are, for example, isocyanate and a compound having a hydroxyl group. Further, the first organic compound and the second organic compound are, for example, a carboxylic acid and amine. In addition, the first organic compound and the second organic compound are, for example, carboxylic acid halide and amine. Further, the first organic compound and the second organic compound are, for example, a carboxylic acid and a compound having a hydroxyl group. Further, the first organic compound and the second organic compound are, for example, a carboxylic acid halide and a compound having a hydroxyl group. Further, the first organic compound and the second organic compound are, for example, carboxylic anhydride and amine.

A mask included in the workpiece in the film forming process may be formed of an organic material, a metal, or a silicon-containing material, and the etching target film may be formed of another silicon-containing material.

Effect of First Embodiment

As described above, the substrate processing method according to the first embodiment includes step a and step b. Step a is a step of providing a workpiece including a substrate, an etching target film formed on the substrate, and a mask having an opening formed on the etching target film on a stage in a chamber. Step b is a step of forming a film having a thickness that differs along the film thickness direction of the mask, on a side wall of the opening. Therefore, according to the first embodiment, it is possible to correct the shape of a high aspect ratio mask that has a shape abnormality such as bowing.

Further, the substrate processing method according to the first embodiment may further include step c of trimming the film. The variation in the opening dimension of the opening in the film thickness direction of the mask after step c is smaller than the variation in the opening dimension of the opening in the film thickness direction of the mask before step c. For this reason, with respect to the opening having a high aspect ratio, the opening dimension may be made uniform in the depth direction.

Further, in step b, a film whose film thickness decreases from the opening side of the mask toward the substrate side may be formed on the side wall of the opening. Further, in step b, the film may be formed only on the upper portion of the side wall of the opening. Therefore, it is possible to selectively correct a shape abnormality occurring near the top, such as bowing. In addition, since no film is formed on the bottom, when etching of the etching target film is performed after step b, the process may be implemented without lowering the selectivity.

Further, in step b, a film having a thickness of about 10% to about 40% of the opening dimension of the opening may be formed on the upper portion of the side wall of the opening. Therefore, the shape of the mask may be corrected while preventing the opening of the mask from being closed.

Further, step b may be performed when the aspect ratio of the opening is 10 or more. Therefore, it is possible to correct the shape of the opening having a high aspect ratio in which an abnormality is likely to occur.

Further, the opening to be corrected may include a bow or a taper. In the substrate processing method according to the embodiment, since the film is formed by changing the film thickness in the stacking direction of the mask, a mask pattern having various shapes such as a bow and a taper may be corrected.

Step b and step c may be repeated. Further, step b and step c may be repeated until the variation in the opening dimension of the opening becomes equal to or less than a predetermined reference value. For this reason, when a desired shape improvement may not be implemented only by performing step b and step c once, the desired shape improvement may be implemented by repeating step b and step c by the number of times corresponding to the shape.

Further, in step b in which the process is repeated n or more times (n is a natural number of 2 or more), the processing conditions may be changed between the n-th process and the (n−1)-th process. Thus, the position and/or thickness of the film formed in step b to be repeatedly performed may be changed. In step (b), a first reactant and a second reactant may be supplied into the chamber, and the first reactant and the second reactant may react with each other to form a film. Further, in step b in which the process is repeatedly performed n' or more times (n' is a natural number of 2 or more), the first reactant and/or the second reactant used in the n'-th process and the (n'−1)-th process may be changed. Thus, the position and/or thickness of the film formed in step b may be changed. For this reason, according to the embodiment, the position and thickness of the film may be finely adjusted according to the state of the workpiece.

Further, step b and step c may be performed in the same chamber (in situ) or in the same system (in system) while maintaining the reduced pressure atmosphere. For this reason, the process may be implemented without the trouble of loading and unloading the workpiece and the trouble of switching the atmosphere in the chamber.

Step b may be performed by CVD. For this reason, the shape of the mask may be corrected using the film thickness difference due to the position of the film formed by CVD.

Further, step b may be performed by ALD in which the adsorption of the precursor or the reaction of the reaction gas is selectively caused on the side wall of the opening. The ALD may precisely control the thickness of a film to be formed, and thus may correct the shape of the mask while preventing the opening from being closed.

Second Embodiment

Figure 9:
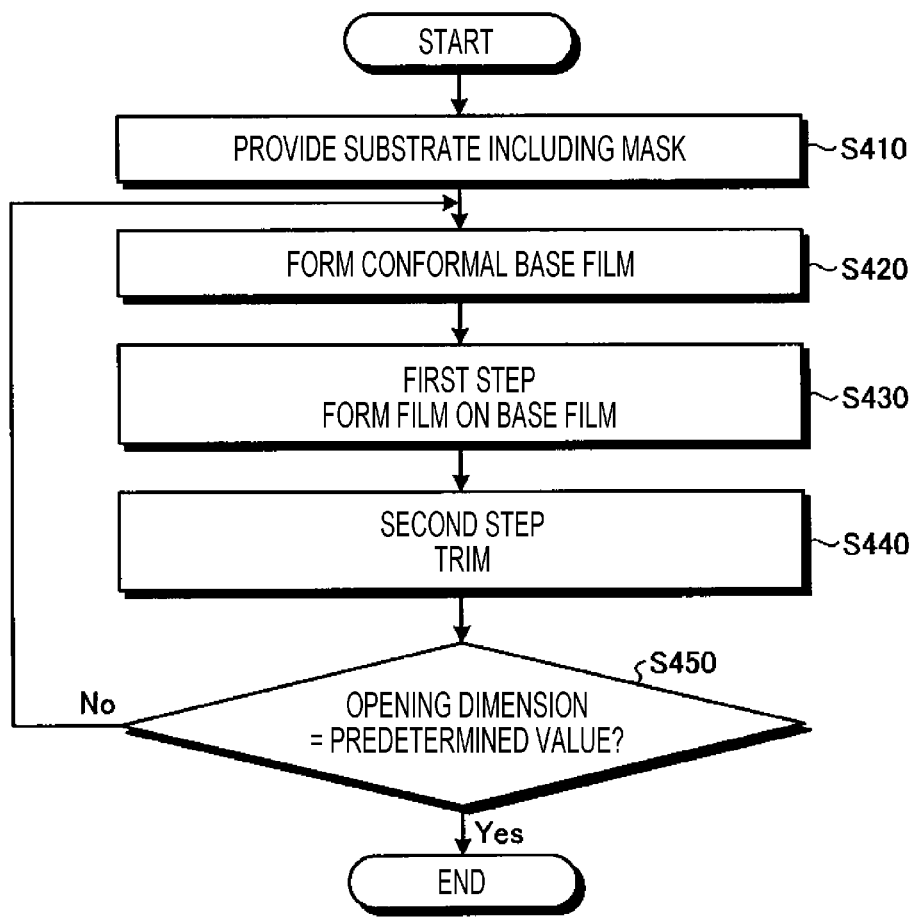
FIG. 9 is a flowchart illustrating an example of a flow of a substrate processing method according to a second embodiment.

FIG. 9 is a flowchart illustrating an example of a flow of a substrate processing method according to a second embodiment. First, a substrate including a mask is provided (step S410 (step a)). Next, a base film is formed on the inner peripheral surface of the opening of the mask (step S420 (step e)). Unlike the film in the first embodiment, the base film is formed over the entire opening. For example, the base film is assumed to be a conformal film. Next, a film is formed on the inner peripheral surface of the opening from above the base film (step S430, a first step (step b)). Like the film of the first embodiment, the film of the second embodiment has a thickness that differs along the stacking direction of the mask. Next, the film is trimmed (step S440, a second step (step c)). Then, it is determined whether the opening dimension after trimming has reached a predetermined value (step S450). When it is determined that the value is the predetermined value ("Yes" in step S450), the process ends. When it is determined that the value is not the predetermined value ("No" in step S450), the process returns to step S420 to repeat the processes.

Unlike the substrate processing method according to the first embodiment, the substrate processing method according to the second embodiment forms two types of films on a mask and then trims the films. For example, when it is desired to suppress the increase in CD at a bottom 210B of an opening 210 caused by trimming (step S130), the substrate processing method according to the second embodiment may be applied.

Next, the substrate processing method according to the second embodiment will be further described with reference to FIGS. 10A to 10E. FIGS. 10A to 10E are diagrams for explaining an example of a workpiece by the substrate processing method according to the second embodiment. The shape of a workpiece S2 illustrated in FIG. 10A is the same as the shape of the workpiece S illustrated in FIG. 2A.

First, in step S410, the workpiece S2 illustrated in FIG. 10A is provided. Then, as illustrated in FIG. 10B, a base film 130a is formed in the opening 200 in step S420. The base film 130a formed in step S420 is formed over the entire opening 200. That is, the base film 130a does not need to have thicknesses that differ along the stacking direction. For example, the base film 130a may have a constant thickness from the top 200T to the bottom 200B. The base film 130a may be formed by, for example, ALD.

Next, a film 130b is formed on the base film 130a (FIG. 10C). The film 130b formed in step S430 has a film thickness that differs along the stacking direction of the mask 120, similarly to the film 130 of the first embodiment. For example, the film 130b is mainly formed on the recess 200X. The method of forming the film 130b is the same as the method of forming the film 130 in the first embodiment.

Here, the base film 130a is formed of the same material as the mask 120. Meanwhile, the film 130b is formed of the same material as the etching target film 110. Further, a material is selected so that a high selectivity may be obtained between the material of the base film 130a and the material of the film 130b. This is because the trimming after the formation of the film 130b (a second step, step S440) is performed by adjusting the processing conditions in order to mainly remove the base film 130a. By setting the processing conditions in this manner, the base film 130a formed in other portions is removed while the film 130b formed on the recess 200X is left. Therefore, it is possible to suppress the variation in the opening dimension of the other portions in the opening 200 while filling the recess 200X.

After the formation of the film 130b, the inside of the opening 200 is trimmed in step S440. The shape of the workpiece S2 after trimming is as illustrated in FIG. 10D. In the example of FIG. 10D, the base film 130a below the side wall 200S and the bottom 200B of the opening 200 is removed, and the base film 130a and the film 130b remain from the recess 200X to the top 200T. Thus, the shape of the mask may be corrected by the substrate processing method according to the second embodiment.

Also, in the second embodiment, each of steps S420, S430, and S440 (steps e, b, and c, respectively) may be repeatedly executed until the opening dimension of the opening 200 reaches a predetermined value. For example, each of the steps may be repeatedly performed until a difference in the opening dimension among the top 200T, the side wall 200S, and the bottom 200B of the opening 200 is within a predetermined value. FIG. 10E illustrates the state of the workpiece in which the shape of the opening 200 has been corrected and the opening dimension has reached a predetermined value. Further, the state of FIG. 10E may be implemented by performing a further etching after step S450.

FIGS. 11A to 11E are diagrams for explaining another example of a workpiece by the substrate processing method according to the second embodiment. A workpiece S4 in FIG. 11A has the same shape as the workpiece 51 in FIG. 3A.

Also, in the example of FIGS. 11A to 11E, a conformal base film 131a is formed over the entire opening 201 before the first step as in FIGS. 10A to 10E (FIG. 11B). Thereafter, films 131b having different film thicknesses are formed along the stacking direction (FIG. 11C). When the trimming in step S440 is performed after the formation of the film 131b, the base film 131a is removed near the bottom 201B, and the taper of the opening 201 is reduced by the remaining base film 131a and film 131b (FIG. 11D). Therefore, the taper of the opening 201 may be corrected by repeating steps S420 to S440 (FIG. 11E).

Effect of Second Embodiment

As described above, the substrate processing method according to the second embodiment further includes, before step c, step e of forming a base film on the side wall of the opening. Therefore, according to the second embodiment, it is possible to correct the shape of the mask while adjusting the opening dimension thereof.

In the second embodiment, the film and the base film may be formed of material having a different etching selectivity. For example, the material is selected such that the amount of the base film removed by the trimming in step c becomes larger than the amount of the film having a thickness that differs along the stacking direction. By doing so, the correction effect by trimming may be improved.

In addition, in the second embodiment, the base film may be formed of the same material as the mask, and the films having thicknesses that differ along the stacking direction may be formed of the same material as the etching target film under the mask. For this reason, when etching is performed under etching conditions according to the mask, the film may be left, and the shape of the mask may be corrected efficiently.

Third Embodiment

In the second embodiment, the base film is conformally formed of the same material as the mask. The disclosure is not limited to this, and a sub-conformal base film may be formed according to the shape of the mask. In the third embodiment, formation of a sub-conformal base film will be described.

In the first and second embodiments, films having film thicknesses that differ in the stacking direction are formed by, for example, a sub-conformal ALD. However, the film formation by the sub-conformal ALD is difficult to control when the aspect ratio of a pattern to be formed is small. This is because in the case of a pattern having a small aspect ratio, the precursor and the reaction gas reach the bottom of the pattern in a short time.

Therefore, in the third embodiment, first, when the aspect ratio of the mask opening is reduced, a base film is formed to increase the aspect ratio (hereinafter, also referred to as step d). Then, after increasing the aspect ratio in advance, the sub-conformal ALD is executed to correct the mask shape. In the following description, the phrase "low aspect ratio" indicates an aspect ratio of less than 5.

FIGS. 12A to 12E are diagrams for explaining a substrate processing method according to the third embodiment. A workpiece S5 illustrated in FIGS. 12A to 12E includes an etching target film 110 formed on a substrate and a mask 120, similarly to the workpiece S illustrated in FIGS. 2A to 2D.

Figure 12A:
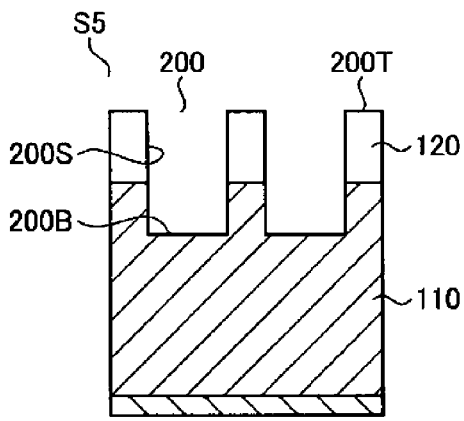
FIGS. 12A to 12E are diagrams for explaining a substrate processing method according to a third embodiment.

First, a workpiece S5 in which a pattern having an aspect ratio of less than 5 is formed on the mask 120 and the etching target film 110 is provided (FIG. 12A). The aspect ratio calculated from the top surface of the mask 120 may be about 1 to 2.

Figure 12B:
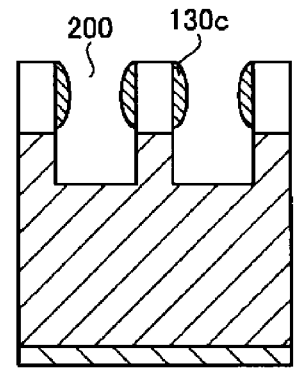

Next, a process of reducing the opening dimension of the opening 200 formed in the workpiece S5, that is, the width of the top 200T of the opening 200 is performed. For example, the base film 130c is formed on the side wall 200S of the opening 200 by a chemical vapor deposition (CVD) or a physical vapor deposition (PVD). The base film 130c is formed mainly on the upper portion of the side wall 200S of the opening 200, and is formed using processing conditions not formed on the lower portion of the side wall 200S and the bottom 200B of the opening 200 (FIG. 12B).

Figure 12C:
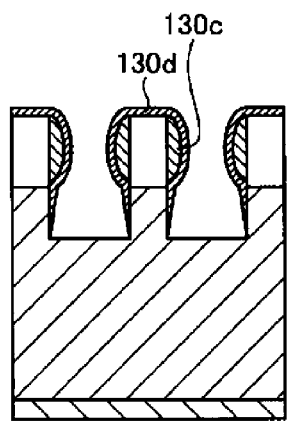

Next, as in the first embodiment, a film 130d is formed by ALD under the condition that the process is terminated in a state where the adsorption of the precursor or the reaction of the reaction gas is unsaturated, that is, the process is not completed up to the bottom surface. At this time, the film 130d is formed on the side wall 200S of the opening 200 and is not formed on the bottom 200B (FIG. 12C). The process in FIG. 12C corresponds to, for example, the first step in FIG. 1 (step b).

Figure 12D:
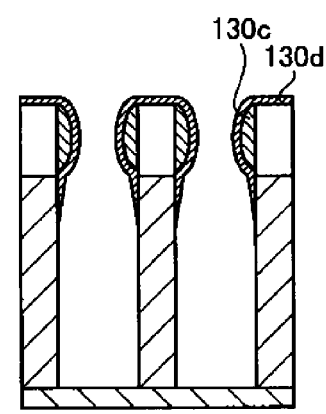

Next, the etching target film 110 is etched (FIG. 12D). When the depth dimension of the opening 200 reaches a predetermined dimension, or when the etching processing time reaches a predetermined processing time, the etching is terminated. The end timing of the etching may be set arbitrarily.

Figure 12E:
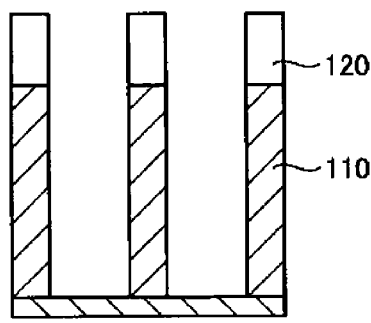

Next, the base film 130c and the film 130d remaining above the opening 200 are removed (FIG. 12E). The processes in FIGS. 12D and 12E correspond to, for example, the second step in FIG. 1 (step c).

As described above, according to the substrate processing method of the third embodiment, a sub-conformal ALD film may be formed for a pattern having a small aspect ratio, for example, less than 5. In the first and second embodiments, when forming films having film thicknesses that differ along the stacking direction, the processing conditions are adjusted so that the amount of the film formation gradually decreases from the upper portion to the lower portion of the side wall of the opening. However, when the aspect ratio of the pattern formed on the workpiece is small, the precursor and the reaction gas reach the bottom of the pattern in a short time. Therefore, it is difficult to form a sub-conformal ALD film for a pattern with a low aspect ratio even when the processing conditions are studied. Meanwhile, when CVD or PVD is used for a pattern with a low aspect ratio, a fine control of the film thickness is difficult.

Therefore, in the third embodiment, when the aspect ratio of the pattern formed on the workpiece is small, a process of reducing the opening dimension of the pattern is executed in advance (FIG. 12B). By performing such a process, the aspect ratio of the pattern is increased, and the amounts of the precursor and the reaction gas entering the opening are suppressed. For this reason, according to the third embodiment, a sub-conformal ALD film may be formed even for a pattern with a low aspect ratio in order to achieve fine control of the film thickness.

Figure 13:
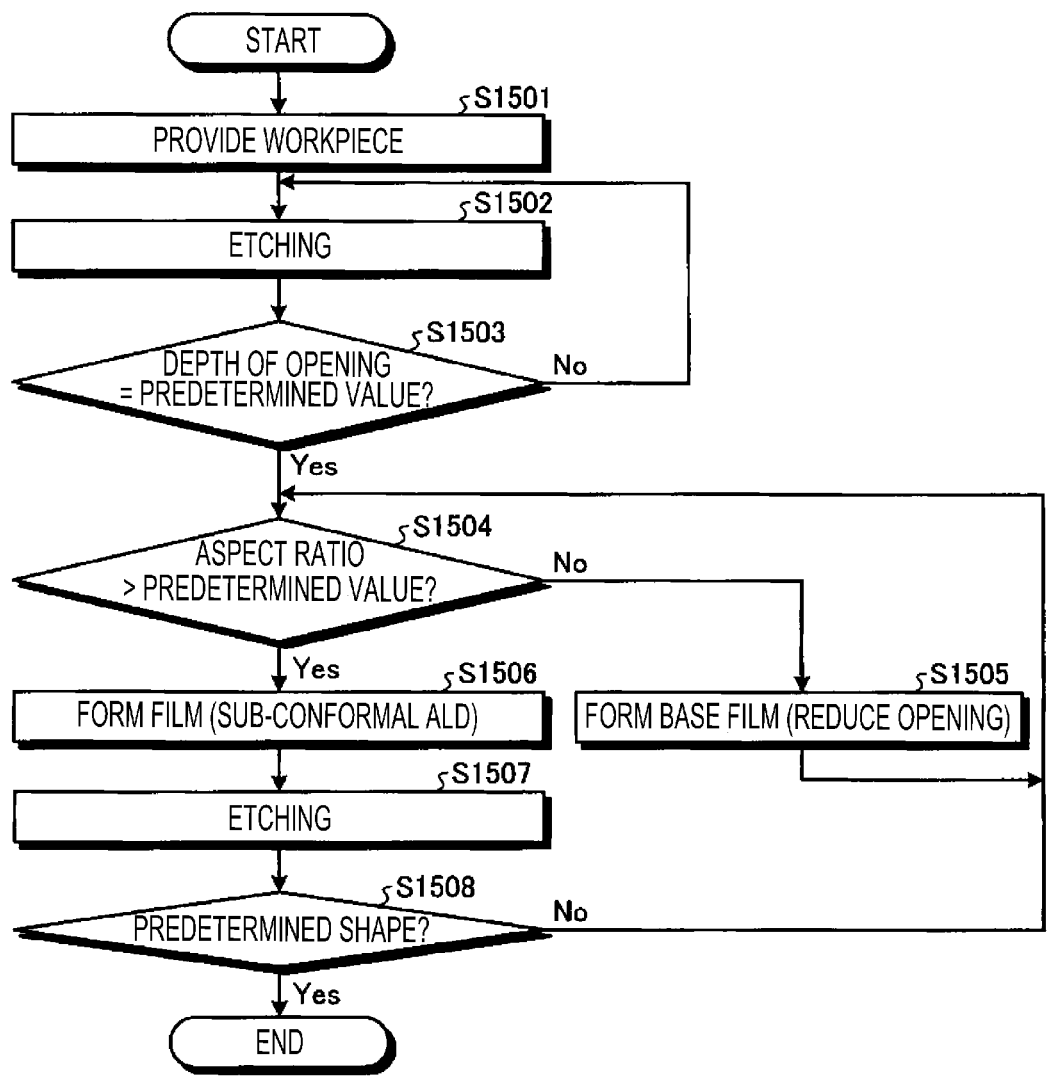
FIG. 13 is a flowchart illustrating an example of a flow of the substrate processing method according to the third embodiment.

FIG. 13 is a flowchart illustrating an example of a flow of the substrate processing method according to the third embodiment. First, the workpiece S5 in which the mask 120 is formed on the etching target film 110 and a pattern for etching is formed on the mask 120 is provided (step S1501, step a). Next, the mask 120 is etched (step S1502). It is determined whether the depth of the opening 200 formed in the etching target film 110 after the etching has reached a predetermined value (step S1503). When it is determined that the value has not reached the predetermined value ("No" in step S1503), the process returns to step S1502 and the etching is repeated. Meanwhile, when it is determined that the value has reached the predetermined value ("Yes" in step S1503), it is determined whether the aspect ratio of the opening 200 is equal to or more than a predetermined value (e.g., 10) (step S1504). When it is determined that the aspect ratio is less than the predetermined value ("No" in step S1504), the base film 130c is formed to narrow the width of the opening 200 (step S1505, step d). Meanwhile, when it is determined that the aspect ratio is equal to or more than the predetermined value ("Yes" in step S1504), the film 130d is formed (step S1506, step b). The process of forming the film 130d is the same as the process of forming the film 130 in the first embodiment. For example, the film 130d may be formed by performing step S120 in FIG. 1. After the formation of the film 130d, trimming and etching are further performed (step S1507, step c). Then, it is determined whether the workpiece S5 has a predetermined shape (step S1508). For example, it is determined whether the dimension of the opening formed in the mask 120 by etching is a predetermined value. When it is determined that the dimension is not the predetermined value ("No" in step S1508), the process returns to step S1504 to repeat the process. Meanwhile, when it is determined that the dimension is the predetermined value ("Yes" in step S1508), the process ends. This ends the substrate processing method according to the third embodiment.

As described above, in the third embodiment, even for a pattern with a low aspect ratio, a film may be formed by the sub-conformal ALD with a high aspect ratio by executing a process of narrowing the opening in advance.

Further, in the third embodiment, the phrase "low aspect ratio" is defined as an aspect ratio of less than 5 and is applied to a pattern having a low aspect ratio. However, even when the pattern has an aspect ratio of 5 or more, when the aspect ratio is less than 10, it may be difficult to implement the sub-conformal film formation. For this reason, the method of the third embodiment may be applied to a pattern having an aspect ratio of 5 to 10.

In addition, the base film 130c is preferably formed using a material that may be removed in a subsequent process. For example, the base film 130c is formed of $SiO_2$, SiN, or SiC. When forming an $SiO_2$ base film 130c, an aminosilane-based gas, $SiCl_4$, or $SiF_4$ may be used as a precursor. Further, when forming an SiN base film 130c, an aminosilane-based gas, $SiCl_4$, DCS, or HDCS may be used as a precursor. Further, for example, the base film 130c may be an organic film such as a carbon-containing film, or a metal film containing titanium (Ti) or tungsten (W).

Effect of Third Embodiment

As described above, the substrate processing method according to the third embodiment further includes step d of forming a base film above the side wall of the opening and reducing the dimension of the opening above the side wall of the opening. Step d increases the aspect ratio of the opening. Therefore, according to the third embodiment, the film formation using a sub-conformal ALD may be implemented even for an opening having a low aspect ratio.

Step d may be performed before step b. Therefore, according to the third embodiment, the sub-conformal film formation control in step b may be more easily implemented as compared with the opening having a low aspect ratio.

Further, step d may be performed when the aspect ratio of the opening is less than 5. Therefore, according to the third embodiment, the film formation may be performed after adjusting the aspect ratio of the opening to a value suitable for film formation control.

Further, the mask provided in the workpiece to which the substrate processing method according to the third embodiment is applied may include a dielectric. Step d may be performed when the aspect ratio of the opening is less than 10. For this reason, according to the third embodiment, a mask shape correction may be implemented using a process that is difficult to control for an opening with a low aspect ratio, such as a sub-conformal ALD.

Fourth Embodiment

Figure 14:
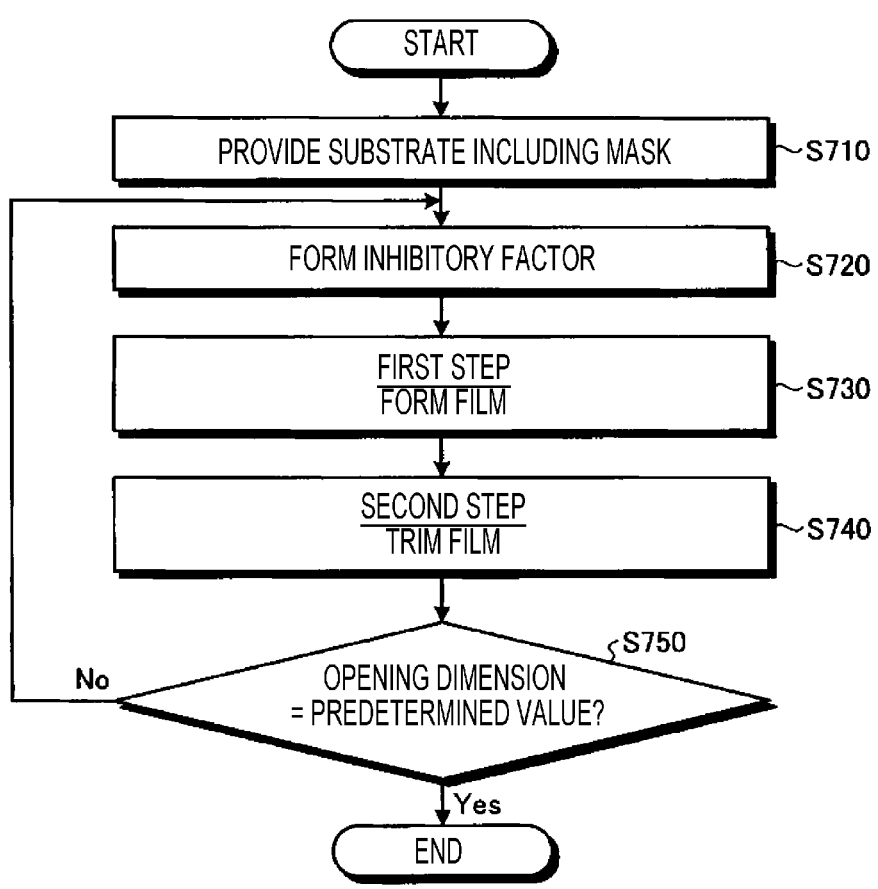
FIG. 14 is a flowchart illustrating an example of a flow of a substrate processing method according to a fourth embodiment.

FIG. 14 is a flowchart illustrating an example of a flow of a substrate processing method according to a fourth embodiment. First, a substrate including a mask is provided (step S710 (step a)). Next, an inhibitory factor is formed at a predetermined position of the opening of the mask (step S720, step f). For example, an inhibitor layer is formed on a mask by CVD using a gas containing an inhibitory factor (hereinafter, also referred to as an inhibitor). Next, a film is formed in the opening (step S730, step b). Next, the film is trimmed (step S740, step c). Then, it is determined whether the opening dimension (CD) of the opening after trimming has reached a predetermined value (step S750). When it is determined that the opening dimension is the predetermined value ("Yes" in step S750), the process ends. Meanwhile, when it is determined that the opening dimension is not the predetermined value ("No" in step S750), the process returns to step S720 to repeat the process.

Next, the substrate processing method according to the fourth embodiment will be further described with reference to FIGS. 15A to 15D. FIGS. 15A to 15D are diagrams for explaining an example of a workpiece by the substrate processing method according to the fourth embodiment. A workpiece S6 illustrated in FIGS. 15A to 15D is the same as the shape of the workpiece S illustrated in FIGS. 2A to 2D.

Figure 15:
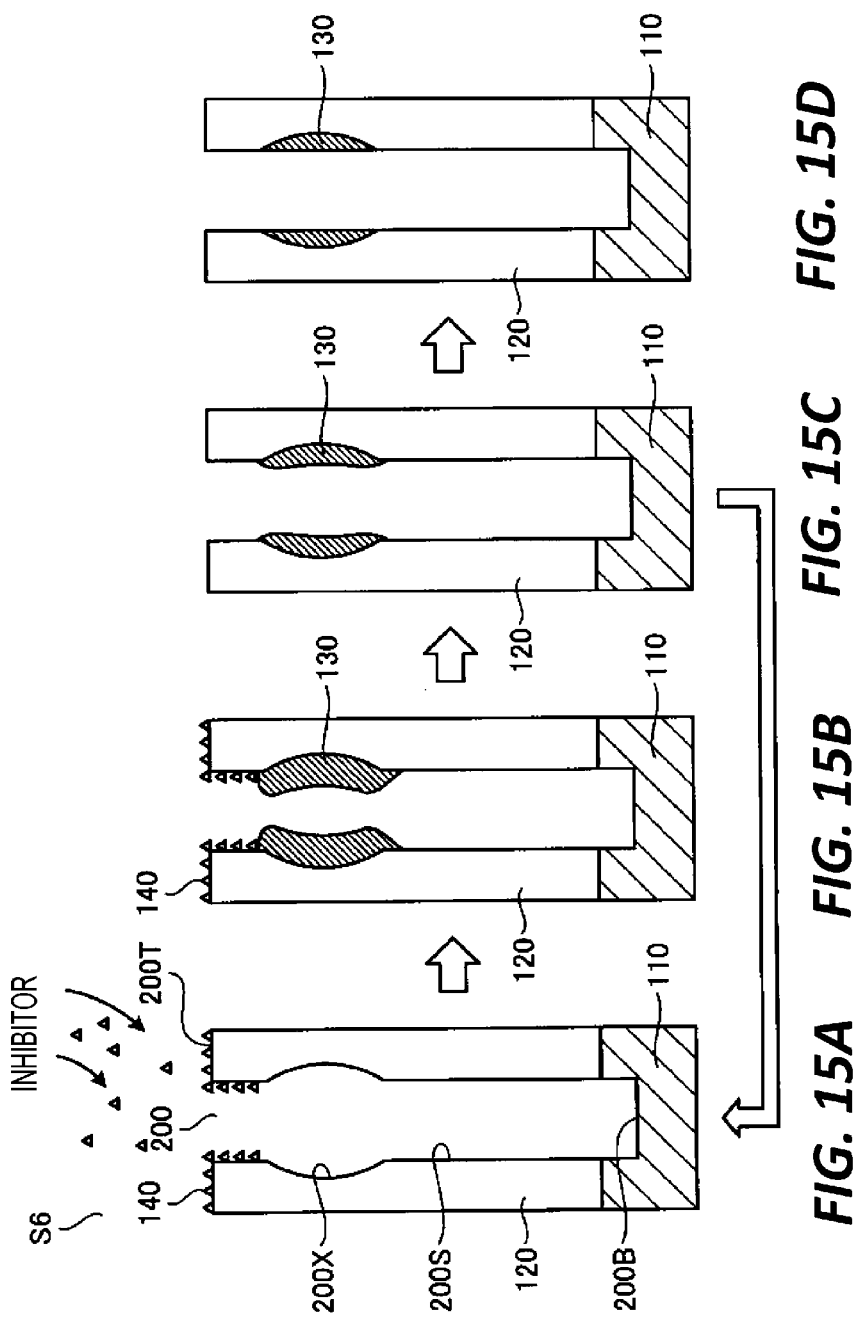
FIGS. 15A to 15D are diagrams for explaining an example of a workpiece by the substrate processing method according to the fourth embodiment.

First, the workpiece S6 is provided (step S710). Then, a process of step S720 is performed on the workpiece S6 to form the inhibitor layer 140 (FIG. 15A). The gas containing an inhibitory factor supplied to form the inhibitor layer 140 is, for example, a carbon-containing gas. The carbon-containing gas is, for example, a fluorocarbon gas, a fluorohydrocarbon gas, or a hydrocarbon gas. In step S720, when plasma CVD is performed using a fluorocarbon gas, a fluorocarbon film is formed as the inhibitor layer 140. Further, in step S720, when plasma CVD is performed using a fluorohydrocarbon gas, a fluorohydrocarbon film is formed as the inhibitor layer 140. Further, in step S720, when plasma CVD is performed using a hydrocarbon gas, a hydrocarbon film is formed as the inhibitor layer 140. The fluorocarbon film, the fluorohydrocarbon film, and the hydrocarbon film are hydrophobic films.

In step S720, the processing conditions are adjusted so that the inhibitor layer 140 is formed only above the mask 120. The inhibitor layer 140 is formed, for example, on the side wall 200S and the top 200T above the recess 200X. For example, the inhibitor layer 140 is formed only on the upper portion of the opening 200 using CVD. In addition, by making the formation position of the inhibitor layer dependent on the aspect, the film formation position on the side wall may be adjusted. Further, by changing the composition of the inhibitor layer, it is possible to inhibit both the adsorption of the precursor and the adsorption of the reaction gas of ALD to be performed later. For example, formation of an inhibitor layer containing carbon may inhibit oxidation, and formation of an inhibitor layer containing CF may inhibit adsorption of a precursor.

Next, in step S730, the film 130 is formed by, for example, ALD. ALD includes a first reaction step of introducing a precursor, a first purging step of removing an excessive precursor, a reforming step of introducing a reaction gas to reform the precursor, and a second purging step of removing an excessive reaction gas.

In the first reaction step, for example, an aminosilane-based gas, a silicon-containing gas, a titanium-containing gas, a hafnium-containing gas, a tantalum-containing gas, a zirconium-containing gas, or an organic-containing gas is used as a precursor. The precursor is adsorbed to a region where the inhibitor layer 140 is not formed to form a precursor layer. When adsorbing the precursor, plasma may or may not be generated.

The first purging step is a step of performing a purging with an inert gas such as argon or nitrogen gas after the precursor layer is formed. Purging reduces or eliminates the precursor, mainly in the gas phase, remaining in the chamber. Purging may be performed by evacuating the chamber. The precursor that has excessively adhered is removed by purging, and the precursor layer becomes substantially a monolayer.

In the reforming step, the precursor layer is converted (reformed) into an atomic layer by exposing the precursor layer to a reaction gas. The reaction gas used in the reforming step is an oxygen-containing gas, a nitrogen-containing gas, or a hydrogen-containing gas. The reaction gas may include, for example, any one of $O_2$ gas, $CO_2$ gas, NO gas, $SO_2$ gas, $N_2$ gas, $H_2$ gas, and $NH_3$ gas. The precursor layer is reformed by the reaction gas to form the film 130, and the surface of the inhibitor layer 140 is removed, thereby reducing the film thickness of the inhibitor layer 140.

After the reforming step, in the second purging step, the processing space is evacuated with an inert gas such as argon or nitrogen gas. Purging reduces or eliminates the reaction gas remaining in the chamber. Purging may be performed by evacuating the chamber.

Depending on the type of the film to be formed, the types of the precursor and the reaction gas may be selected. For example, when a silicon oxide film is formed as the film 130, an aminosilane-based, $SiCl_4$, or $SiF_4$ may be used as a precursor, and an oxygen-containing gas such as $O_2$ may be used as a reaction gas. Further, when a silicon nitride film is formed as the film 130, an aminosilane-based, $SiCl_4$, dichlorosilane (DCS), or hexachlorodisilane (HCDS) may be used as a precursor, and a nitrogen-containing gas such as $N_2$ or $NH_3$ may be used as a reaction gas. In addition, as a method of forming an organic film as the film 130, a molecular film deposition (Molecular Layer Deposition: MLD) may be used. When a titanium film or a titanium oxide film is formed as the film 130, TDMAT (tetrakis(dimethylamino) titanium) and titanium tetrachloride ($TiCl_4$) may be used as a precursor, and a reducing gas or an oxidizing gas may be used as a reaction gas. Further, when a tungsten film is formed, $WF_6$ may be used as a precursor, and a reducing gas may be used as a reaction gas.

A precursor may be selected to control the depth of the formed film 130. For example, among aminosilane-based gases, an aminosilane (divalent aminosilane or trivalent aminosilane) gas having two or three amino groups rather than an aminosilane (monovalent aminosilane) gas having one amino group may be preferably selected as a precursor that forms the film 130 only above the pattern. Further, in order to form the film 130 at a deep position in the pattern, it is desirable to use a monovalent aminosilane gas. Furthermore, the controllability of the coverage may be improved by combining with processing parameters such as a processing time, a temperature of a stage, and pressure in a processing chamber.

As described above, in step S730, the film 130 is selectively formed in a region where the inhibitor layer 140 is not formed. For example, in the example illustrated in FIG. 15B, the inhibitor layer 140 is formed on the side wall 200S and the top 200T above the recess 200X. Then, the film 130 is not formed in a region where the inhibitor layer 140 is formed, and is formed on the recess 200X where the inhibitor layer 140 is not formed. The film 130 of the fourth embodiment has a film thickness that differs along the stacking direction, as in the first embodiment. For example, a film is selectively formed using the above-described sub-conformal ALD so that the film 130 is not formed in a region on the bottom 200B side of the recess 200X.

Next, in step S130, the film 740 is trimmed. The inhibitor layer 140 is removed and the surface of the film 130 is scraped by the trimming, so that the inner peripheral surface of the opening 200 becomes smooth (FIG. 15C). By repeating the formation of the inhibitor layer 140 (step S720), the first step (step b), and the second step (step c), the recess 200X may be gradually filled to correct the shape of the mask. When the recess 200X is finally filled, the workpiece S6 is in a state illustrated in FIG. 15D.

As described above, in the fourth embodiment, the formation of the film 130 near the top 200T of the opening 200 is prevented by using the inhibitor layer 140, and the opening is prevented from being closed. In order to etch the etching target film 110 into a desired shape, it is desirable to suppress the shape like the recess 200X and also to prevent the opening 210 from being closed. In this regard, as in the fourth embodiment, by preventing the film 130 from being formed on the top 210T of the opening 210, it is possible to prevent the opening from being closed by the film 130. Further, when a sub-conformal ALD is used to form the film 130, the film thickness may be controlled with high accuracy.

The formation of the inhibitor layer 140 (step f) and the formation of the film 130 (step b) may be repeatedly performed a plurality of times. For example, by repeatedly performing steps S720 and S730 while changing the position where the inhibitor layer 140 is formed, it is possible to fill the recess 200X while adjusting the thickness of the film 130 to be formed according to the shape of the recess 200X. In this case, after steps S720 and S730 are repeatedly performed a plurality of times, the trimming of step S740 may be performed.

Figure 16:
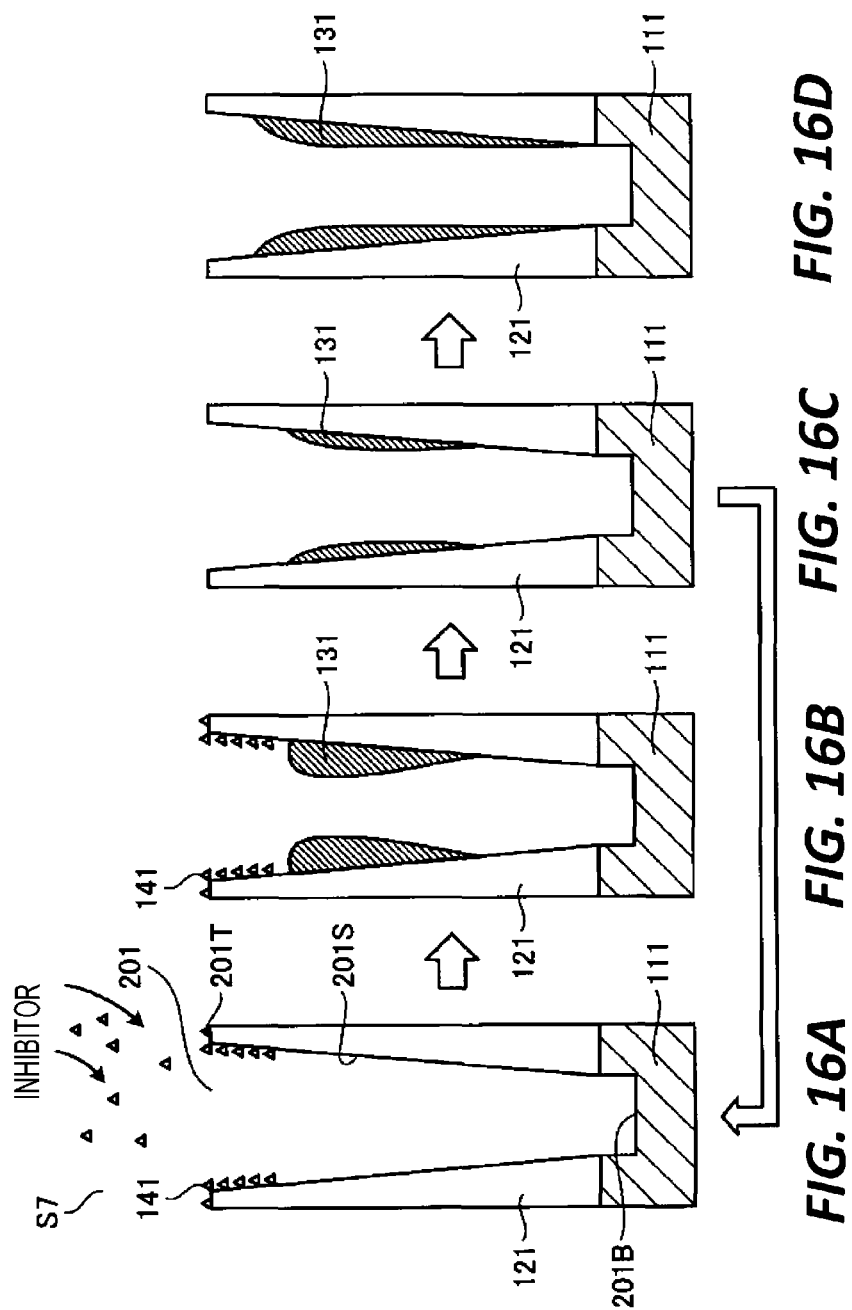
FIGS. 16A to 16D are diagrams for explaining another example of a workpiece by the substrate processing method according to the fourth embodiment.

FIGS. 16A to 16D are diagrams for explaining another example of a workpiece by the substrate processing method according to the fourth embodiment. A workpiece S7 in FIG. 11A has the same shape as the workpiece 51 in FIG. 3A. Also, in the tapered workpiece S7, the inhibitor layer 141 is first formed on the mask (FIG. 16A), and the film 131 is then formed (FIG. 16B). Then, by trimming the film 131 (FIG. 16C), the shape of the opening 201 may be corrected while preventing closing of the opening (FIG. 16D). In the case of the workpiece S7 in FIGS. 16A to 16D as well, the formation of the inhibitor layer 141 and the formation of the film 131 may be repeated a plurality of times while shifting the position where the inhibitor layer 141 is formed. By shifting the position where the inhibitor layer 141 is formed, the film 131 may be formed to have a taper opposite to the opening 201. That is, a film 131 whose film thickness decreases from the top 201T toward the bottom 201B may be formed. By forming such a film 131, the shape of the mask pattern may be corrected in fewer steps.

In the fourth embodiment, the inhibitor layers 140 and 141 are formed by CVD. When the film is formed by CVD, the inhibitor layers 140 and 141 are less likely to be formed in the shaded portions when viewed from the opening side, such as the recess 201X in the opening 201. Therefore, the inhibitor layer 140 may be easily formed above the recess 201X.

In the fourth embodiment, the films 130 and 131 are not formed on the tops 200T and 201T by using the inhibitor layers 140 and 141. Therefore, it is possible to prevent the opening 130 from being closed by the films 130 and 131.

In the above embodiment, after the inhibitor layers 140 and 141 are formed, the films 130 and 131 may be formed by the sub-conformal ALD. Alternatively, a self-assembled monolayer (SAM) may be formed using an organic material that is chemically adsorbed on the masks 120 and 121 but not on the inhibitor layers 140 and 141.

Effect of Fourth Embodiment

As described above, the substrate processing method according to the fourth embodiment further includes, before step b, a step of forming an inhibitory factor that inhibits film formation (step f). Therefore, the position where the film is formed may be controlled more precisely. In addition, by forming an inhibitor layer that inhibits the formation of a film above the opening, the opening may be prevented from being closed by the film.

(Adjustment of Opening Dimension)

By the substrate processing method according to the above embodiment, the shape of the mask may be corrected such that the opening dimension of the mask is substantially the same at the top, side wall, and bottom. After correcting the shape of the mask, a process of adjusting the opening dimension may be further performed. Alternatively, a process of adjusting the opening dimension may be executed simultaneously with the mask shape correction.

For example, it is assumed that the shape of the workpiece is corrected to the shape illustrated in FIG. 2D by the substrate processing methods according to the first to fourth embodiments. Thereafter, etching or film formation may be further performed to reduce or increase the opening dimension of the bottom 210B of the opening 210.

Further, for example, when correcting the shape of the workpiece by the substrate processing method according to the second embodiment, the dimension of the opening 210 may be reduced by adjusting the thickness of the base film formed in step S420.

Further, for example, for a pattern having a low aspect ratio and having a tapered shape with a widened top, a process of narrowing the width by CVD or PVD (third embodiment) is performed, and the sub-conformal ALD is then performed. By doing so, the tapered shape may be corrected. In addition, even when a pattern having a high aspect ratio turns into having a low aspect ratio while the process is repeated, a sub-conformal ALD may be easily implemented by executing the process of reducing the dimension of the opening. When a fine adjustment of the mask shape is performed, it is difficult to control high resolution by CVD or PVD. For this reason, when the mask has a low aspect ratio, fine adjustment may be implemented by performing a sub-formal ALD or an ALD after narrowing the width by CVD or PVD.

(Processing Timing)

The substrate processing methods according to the first to fourth embodiments may be executed immediately after the mask is formed (i.e., before the etching target film is etched). Further, the process may be executed when a shape abnormality of the mask occurs after the etching of the etching target film is started. In any case, by selecting or combining the first to fourth embodiments according to the position and shape of the shape abnormality to be corrected, the shape of the mask may be corrected while suppressing the influence on the properties of the etching target film.

(Modification 1—Adjustment When Mask Height Decreases)

After the shape of the mask is corrected by the substrate processing method according to the embodiment, the etching target film is etched. The etching removes not only the etching target film but also the mask. For this reason, the position of the film formed in the first step relatively changes in the depth direction of the mask. Therefore, the processing conditions of the first step may be adjusted according to the change in the thickness of the mask.

Figure 17:
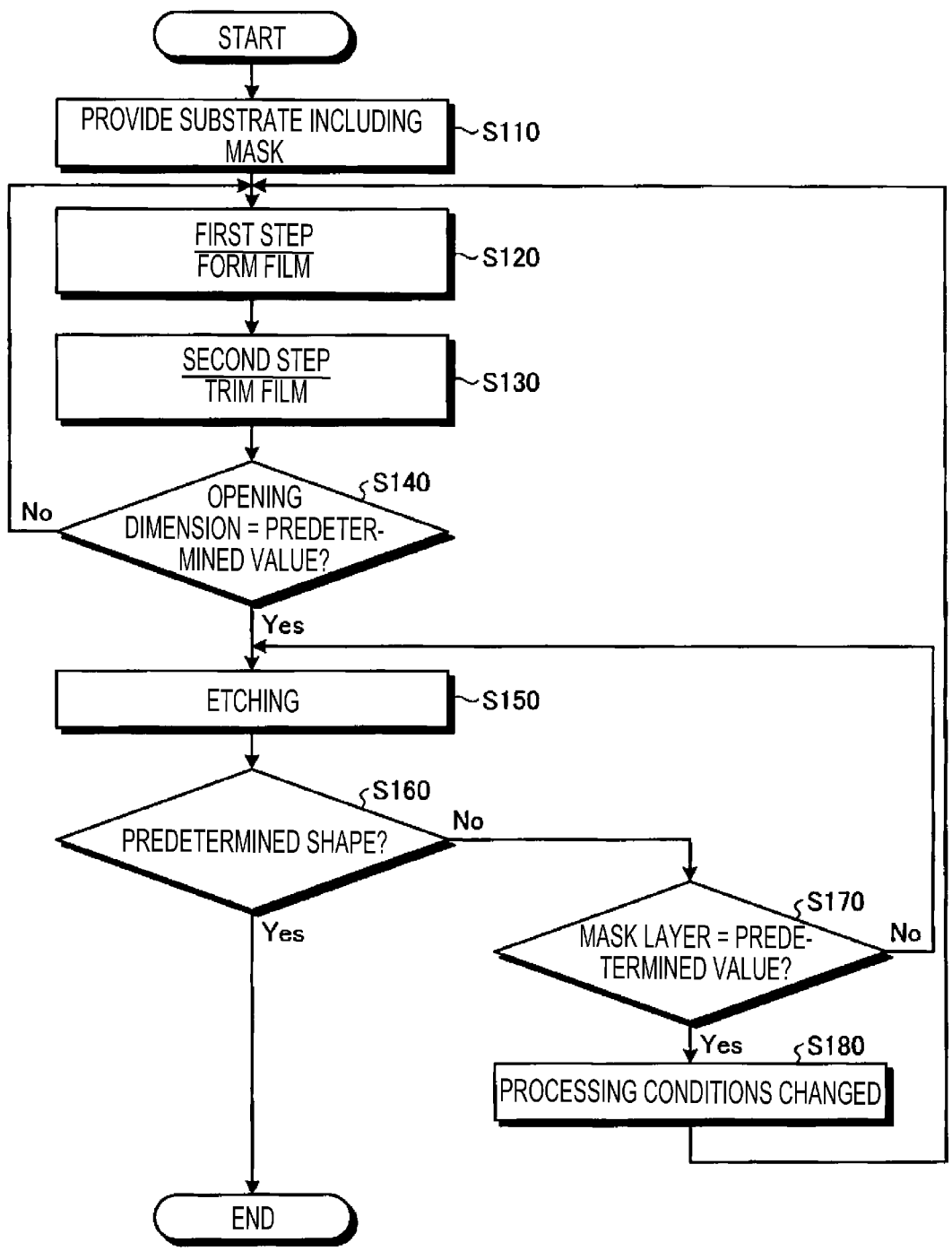
FIG. 17 is a flowchart illustrating an example of a flow of a substrate processing method according to modification 1.

FIG. 17 is a flowchart illustrating an example of a flow of a substrate processing method according to modification 1. FIGS. 18A to 18D are diagrams for explaining the substrate processing method according to modification 1.

In the substrate processing method of modification 1, the processes of steps S110 to S140 are the same as that of the first embodiment (FIG. 1). After the mask shape is corrected by the processes of steps S110 to S140, the etching target film is etched (step S150). It is determined whether the shape after etching is a predetermined shape (step S160). When it is determined that the shape after etching is not the predetermined shape ("No" in step S160), it is determined whether the mask height is a predetermined value (step S170). When it is determined that the mask height is the predetermined value ("Yes" in step S170), the processing conditions of the first step are changed (step S180). Then, the first step (step S120) is executed again under the changed processing conditions. Meanwhile, when it is determined that the mask height is not the predetermined value ("No" in step S170), the process returns to step S150 to repeat the etching. When it is determined that the shape after etching is not the predetermined shape ("Yes" in step S160), the process ends.

The substrate processing method of modification 1 will be further described with reference to FIGS. 18A to 18D. A workpiece S8 illustrated in FIGS. 18A to 18D has an etching target film 112 and a mask 122 formed on a substrate. The mask 122 has an opening 202. A recess 202X is formed at the center in the depth direction of the opening 202. When step S120 is performed on the workpiece S8 illustrated in FIG. 18A, a film 132a is formed as illustrated in FIG. 18B. After the trimming of the film 132a, when the opening dimension reaches a predetermined value, etching (step S150) is performed. Due to the etching, the mask 122 is gradually scraped, and the mask height decreases. FIG. 18C illustrates the workpiece S8 whose mask height has been reduced by the etching (step S150). Further, with respect to the workpiece S8 in FIG. 18C, the recess 202X exists in the mask 122. The phrase "predetermined shape" in step S160 may include determining whether the etching target film 112 has a desired shape and whether the mask 122 has a desired shape. The determination as to whether the mask 122 has a desired shape may be a determination as to whether the mask 122 has an abnormal shape. Therefore, when the mask 122 has the recess 202X, it is determined that the shape is abnormal ("No" in step S160), and the mask height is checked. When it is determined that the mask height is equal to or less than the predetermined value ("Yes" in step S170), the processing conditions of the first process are changed according to the mask height (step S180). In FIG. 18C, since the mask height is reduced, the processing conditions are changed to processing conditions according to a distance from the top 202T to the recess 202X. For example, the processing conditions are changed so that the film 132a is formed between the top 202T and the recess 202X. Then, when returning to step S120 and executing the first step under the changed processing conditions, the film 132b is formed in a range different from the film 132a illustrated in FIG. 18B (FIG. 18D). As described above, when the mask height changes during the substrate processing, the processing conditions of the first step are adjusted according to the changed mask height. When the mask is stacked again in the course of the processing, the processing conditions in the first step are also changed according to the mask height after the stacking.

(Modification 2—Temperature Control of Workpiece)

In the above embodiment, the position and thickness of the film formed in the first step are adjusted according to the processing conditions. The thickness of the film may be further adjusted to be different in the plane of the workpiece by controlling the temperature of the workpiece.

FIGS. 19A and 19B are diagrams for explaining a substrate processing method according to modification 2. FIG. 19A illustrates a relationship between the temperature of a workpiece (e.g., a wafer) and the thickness of a film formed on the workpiece. As illustrated in FIG. 19A, the thickness of the film increases as the temperature of the workpiece increases.

FIG. 19B illustrates an example of zone division of a stage that supports a workpiece. The workpiece is generally circular with a diameter of about 300 mm and is supported on a circular stage during substrate processing. The stage has a temperature control mechanism. Therefore, the stage is divided into a plurality of, for example, 27 zones. In the example of FIG. 19B, the stage is divided into a plurality of zones in the circumferential direction and the radial direction. Then, the temperature of each zone may be controlled independently of each other. The temperature is relatively increased at the position where the film formation amount is to be increased, and the temperature is relatively decreased at the position where the film formation amount is to be decreased. With this adjustment, when a plurality of openings is formed in one wafer, the thickness of the film formed in the openings may be changed according to the position on the wafer.

In the wafer surface, the recess formed on the side wall of the opening by etching tends to be small at the center in the radial direction and large at the outside in the radial direction. Therefore, for example, by controlling each zone so that the temperature is low at the radial center of the wafer and high at the radial outside of the wafer, the uniformity of the opening dimension in the wafer plane may be improved. However, the present disclosure is not limited to this, and by adjusting the temperature of the stage, it is possible to change the thickness of the film formed according to the in-plane position in the wafer, and it is possible to correct various shapes.

As described above, in the above embodiment, in step b, each of a plurality of zones provided on the stage on which the workpiece is disposed and configured such that temperatures of the plurality of zones are independently controllable may be controlled to a different temperature depending on the in-plane position of each of the plurality of zones, and the thickness of the film may be changed according to the temperatures of the plurality of zones. For example, the thickness of the film formed in the first step (FIG. 1, step S120) may be changed according to the temperature of the stage. For this reason, according to the embodiment, the uniformity of the film in the wafer surface may be improved. Further, according to the embodiment, the thickness of the film may be corrected according to the in-plane position in the wafer.

In the above embodiment, step b may be repeatedly performed at least n" times (n" is a natural number of 2 or more). Then, in step b of the (n"−1)-th times, each of the plurality of zones provided on the stage on which the workpiece is disposed and configured such that temperatures of the plurality of zones are independently controllable may be controlled to a first temperature distribution. Thus, a film having a first film thickness distribution in the depth direction may be formed. Further, in step b of the n"-th time, each of the plurality of zones may be controlled to a second temperature distribution. Thus, a film having a second film thickness distribution in the depth direction may be formed. For this reason, according to the embodiment, the film may be formed at different positions and/or thicknesses according to the temperature distribution of the stage. Therefore, according to the embodiment, not only the position and/or thickness of the film formed according to the in-plane position, but also the position and/or thickness of the film formed for each process may be controlled.

(Conditioning in Chamber)

Meanwhile, in the above embodiment, for example, the first step (step S120, step b) and the second step (step S130, step c) in FIG. 1 may be executed in one chamber. Further, the first step may be repeatedly executed after the second step. In this case, by-products generated in the second step may adhere to the inside of the chamber and influence the processing result (film performance) of the first step. When the first step and the second step are performed in different chambers, a film of the same type as the film is additionally formed on the inner wall and other component surfaces of the chamber where the first step is performed. Also, only by-products generated by trimming adhere to the inner wall and other component surfaces of the chamber where the second step is performed. Therefore, the state of a film to be formed may be different in a case where only one of the first step and the second step is performed in one chamber and a case where both the first step and the second step are performed in one chamber.

Therefore, after performing the second step (e.g., step S130 in FIG. 1, step c) of the present embodiment, conditioning of the surface exposed to a plasma space in the chamber may be performed. As for the conditioning, (1) cleaning in the chamber and (2) coating in the chamber may be performed.

The cleaning in the chamber is executed, for example, by forming a predetermined cleaning gas into plasma in the chamber and then exhausting the gas. As for the cleaning gas, an oxygen-containing gas such as $O_2$ or $CO_2$ or a hydrogen-containing gas such as $H_2$ or $NH_3$ may be used. The cleaning method is not particularly limited. The cleaning in the chamber is performed, for example, under conditions for removing carbon and fluorine attached to the outermost surface.

Further, the coating in the chamber is performed by forming a predetermined coating gas into plasma in the chamber and then exhausting the gas. As for a coating gas, a silicon oxide film ($SiO_2$) may be formed by CVD or ALD using a silicon-containing gas such as $SiCl_4$ or an aminosilane-based gas and an oxygen-containing gas such as $O_2$. Further, the coating method is not particularly limited. Also, the material to be coated is not particularly limited. The coating is performed, for example, after a plasma treatment using fluorine (such as CF). The coating covers by-products exposed on the outermost surface of the chamber so that the by-products are not exposed to the plasma processing space.

The cleaning and coating for conditioning are performed under the condition that the entire inner wall of the chamber is to be proceeded as well as the vicinity of the stage on which the workpiece is disposed. Further, the cleaning and coating for conditioning may be performed each time one plasma process is performed or may be performed each time a predetermined number of plasma processes is performed. This may prevent the inner surface to which the by-product has adhered from being exposed to the plasma processing space. For this reason, it is possible to prevent the condition and state in the chamber from being changed for each process, and to stabilize the state of the formed film.

Thus, a third step (step g) of applying a coating that covers the by-product adhered to the inner wall of the chamber after the second step (step S130, step c) illustrated in, for example, FIG. 1 of the above embodiment may be further executed. Therefore, it is possible to prevent the properties of the film formed in the first step from fluctuating due to the influence of the by-product generated in the second step.

(Configuration Example of Substrate Processing Apparatus)

Next, an example of a substrate processing apparatus that performs the substrate processing method according to the above embodiment will be described. FIGS. 20A, 20B, 20C, and 20D are diagrams illustrating examples 1 to 4 of the substrate processing apparatus according to the embodiment, respectively.

The substrate processing method according to the above embodiment may be executed while maintaining a vacuum atmosphere in one substrate processing apparatus or may be executed by moving a workpiece in a different chamber. That is, the substrate processing method according to the embodiment may be executed by generating plasma in-situ (while maintaining a vacuum atmosphere around the workpiece) or may be executed by generating plasma ex-situ (in a vacuum atmosphere formed at a position distant from the workpiece).

Figure 20A:
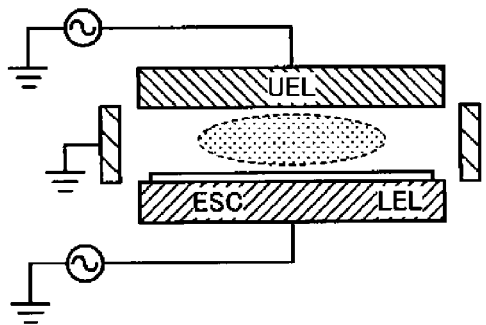
FIG. 20A is a diagram illustrating example 1 of a substrate processing apparatus according to an embodiment.

The substrate processing apparatus illustrated in FIG. 20A is an example of a capacitively coupled plasma (CCP) system. The CCP system generates plasma in a processing space sandwiched between an upper electrode UEL and a lower electrode LEL. The lower electrode LEL also functions as an electrostatic chuck ESC. Further, the lower electrode LEL functions as a stage that holds a workpiece, for example, a semiconductor substrate. The CCP system generates plasma by supplying radio frequency (RF) power supply to at least one of the upper electrode UEL and the lower electrode LEL. The radio frequency power supply may be connected to both the upper electrode UEL and the lower electrode LEL, and a plurality of radio frequency power supplies may be connected to one electrode. Further, the radio frequency power supply may supply radio frequency power supply of a different frequency. Further, a direct current (DC) power supply may be connected to the upper electrode.

Figure 20B:
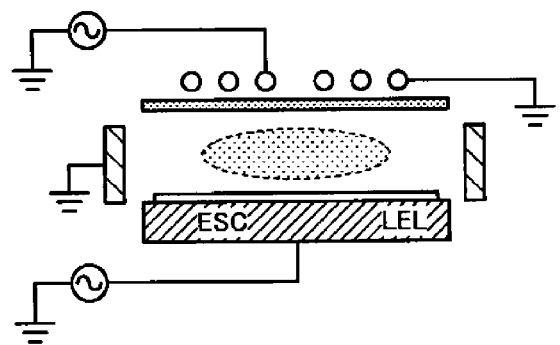
FIG. 20B is a diagram illustrating example 2 of the substrate processing apparatus according to the embodiment.

The substrate processing apparatus illustrated in FIG. 20B is an example of an inductively coupled plasma (ICP) system. The ICP system generates plasma in a processing space sandwiched between an inductive element (e.g., a planar coil, a solenoid type coil, or a helical coil) and a lower electrode LEL. The lower electrode LEL also functions as an electrostatic chuck ESC. Further, the lower electrode LEL functions as a stage that holds a workpiece, for example, a semiconductor substrate. The ICP system generates plasma by supplying radio frequency power supply to an inductive element. As illustrated in FIG. 20B, the radio frequency power supply is connected to both the inductive element and the lower electrode LEL. The radio frequency power supply may supply radio frequency power supply of different frequencies.

Figure 20C:
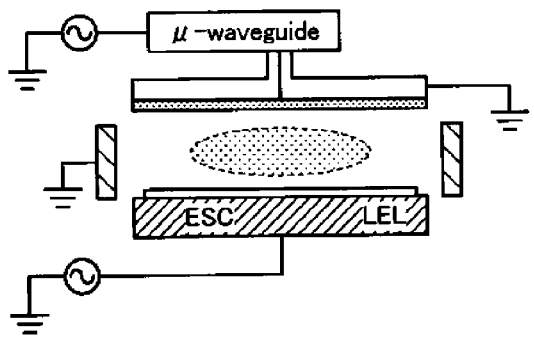
FIG. 20C is a diagram illustrating example 3 of the substrate processing apparatus according to the embodiment.

The substrate processing apparatus illustrated in FIG. 20C is an example of a surface wave plasma (SWP) system. The SWP system generates plasma in a processing space sandwiched between a slot antenna and a lower electrode LEL. The lower electrode LEL also functions as an electrostatic chuck ESC. Further, the lower electrode LEL functions as a stage that holds a workpiece, for example, a semiconductor substrate. The SWP system generates plasma by supplying microwave radio frequency power supply to a slot antenna via a microwave waveguide. As illustrated in FIG. 20C, the radio frequency power supply is connected to both the slot antenna and the lower electrode LEL. The radio frequency power supply may supply radio frequency power of different frequencies.

Figure 20D:
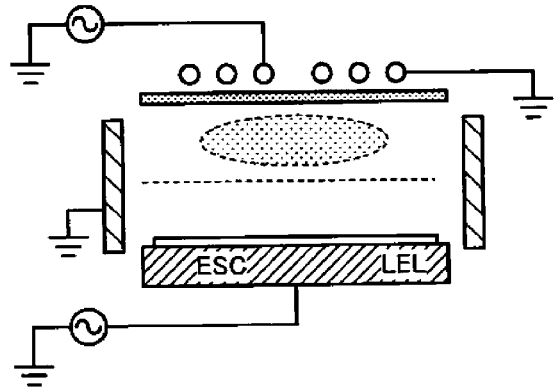
FIG. 20D is a diagram illustrating example 4 of the substrate processing apparatus according to the embodiment.

The substrate processing apparatus illustrated in FIG. 20D is an example of a remote plasma system. The remote plasma system generates plasma at a position distant from the workpiece. For example, the remote plasma system generates plasma in a region separated from the peripheral region of the workpiece by a filter that inhibits transport of charged particles to the peripheral region of the workpiece.

The lower electrode LEL functions as a stage that holds the workpiece, for example, a semiconductor substrate. The remote plasma system generates plasma by supplying radio frequency power supply to a plasma generation device disposed at a position distant from a workpiece. As illustrated in FIG. 20D, the radio frequency power supply is connected to both the plasma generation device and the lower electrode LEL. The radio frequency power supply may supply radio frequency power of different frequencies.

Further, the substrate processing apparatus according to the embodiment illustrated in FIGS. 20A to 20D includes a chamber, a stage, a gas supply, and a controller. The chamber provides a processing space. The stage is provided inside the chamber on which the workpiece is disposed. The gas supply supplies a processing gas into the chamber. The controller causes the substrate processing method to be executed. The substrate processing method includes step (a) and step (b). Step (a) is a step of providing a workpiece including a substrate, an etching target film formed on the substrate, and a mask having an opening formed on the etching target film on a stage in a chamber. Step (b) is a step of forming a film having a thickness that differs along the film thickness direction of the mask, on a side wall of the opening. With such a configuration, the substrate processing apparatus according to the embodiment may correct the shape of the mask.

In addition, the above embodiments may be implemented by combining or modifying the substrate processing apparatuses illustrated in FIGS. 20A to 20D.

According to the present disclosure, the shape of the mask may be corrected.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of processing a substrate including an etching target film and a mask having an opening formed on the etching target film, comprising:
    (a) providing the substrate on a stage in a chamber;
    (b) forming a film having a thickness that differs along a film thickness direction of the mask, on a side wall of the opening; and
    (c) trimming the film,
    wherein when (b) is repeatedly performed n or more times (n is a natural number of 2 or more), a position and a thickness of the film formed in (b) are changed by changing a processing condition in an n-th processing and an (n−1)-th processing, and
    a variation in an opening dimension of the opening in the film thickness direction of the mask after (c) is smaller than a variation in an opening dimension of the opening in the film thickness direction of the mask before (c).

2. The method according to claim 1, wherein (b) and (c) are repeated.

3. The method according to claim 1, wherein (b) and (c) are repeated until the variation in the opening dimension of the opening becomes equal to or less than a predetermined reference value.

4. The method according to claim 1, wherein in (b), the film whose film thickness decreases from an opening side of the mask toward a substrate side is formed on the side wall of the opening.

5. The method according to claim 1, wherein in (b), the film is formed only on an upper portion of the side wall of the opening.

6. The method according to claim 1, wherein in (b), the film is formed on an upper portion of the side wall of the opening to have a film thickness of about 10% to about 40% of the opening dimension of the opening.

7. The method according to claim 1, wherein (b) is performed when an aspect ratio of the opening is 10 or more.

8. The method according to claim 1, wherein the opening includes a bow or a taper.

9. The method according to claim 1, wherein in (b), a first reactant and a second reactant are supplied into the chamber, and the first reactant and the second reactant are reacted to form the film, and
    when (b) is repeatedly performed n' or more times (n' is a natural number of 2 or more), the position and the thickness of the film formed in (b) are changed by changing the first reactant and the second reactant used in an n'-th processing and an (n'−1)-th processing.

10. The method according to claim 1, further comprising:
    (d) forming a base film on an upper portion of the side wall of the opening to reduce an opening dimension on the upper portion of the side wall of the opening.

11. The method according to claim 10, wherein (d) is performed before (b).

12. The method according to claim 10, wherein (d) is performed when an aspect ratio of the opening is less than 10.

13. The method according to claim 1, wherein (b) and (c) are performed in a same chamber (in-situ) or in a same system (in-system) while maintaining a reduced pressure atmosphere.

14. The method according to claim 1, wherein (b) is performed by a chemical vapor deposition.

15. The method according to claim 1, wherein (b) is performed by an atomic layer deposition in which an absorption of a precursor or a reaction of a reactive gas is selectively caused on the side wall of the opening.

16. The method according to claim 1, further comprising:
    (e) forming a base film on the side wall of the opening before (c).

17. The method according to claim 16, wherein the film and the base film are respectively formed of materials having a different etching selectivity.

18. The method according to claim 16, wherein the base film is formed of a same material as the mask, and
    the film is formed of a same material as an etching target film under the mask.

19. The method according to claim 1, further comprising:
    (f) forming an inhibitor that inhibits formation of the film before (b).

20. The method according to claim 1, further comprising:
    (g) applying a coating for covering by-products adhering to an inner wall of the chamber after (c).

21. A method of processing a substrate including an etching target film and a mask having an opening formed on the etching target film, comprising:
    (a) providing the substrate on a stage in a chamber;
    (b) forming a film having a thickness that differs along a film thickness direction of the mask, on a side wall of the opening; and
    (c) trimming the film,
    wherein in (b), each of a plurality of zones provided on the stage on which the substrate is disposed and configured such that temperatures of the plurality of zones are independently controllable is controlled to a different temperature according to an in-plane position of each of the plurality of zones, thereby changing the thickness of the film according to temperatures of the plurality of zones, and a variation in an opening dimension of the opening in the film thickness direction of the mask after (c) is smaller than a variation in an opening dimension of the opening in the film thickness direction of the mask before (c).

22. A method of processing a substrate including an etching target film and a mask having an opening formed on the etching target film, comprising:

(a) providing the substrate on a stage in a chamber;
(b) forming a film having a thickness that differs along a film thickness direction of the mask, on a side wall of the opening; and
(c) trimming the film, wherein (b) is repeatedly performed at least n" times (n" is a natural number of 2 or more), in (b) of an (n"−1)-th processing, each of a plurality of zones provided on the stage on which the substrate is disposed and configured such that temperatures of the plurality of zones are independently controllable is controlled in a first temperature distribution, thereby forming the film having a first film thickness distribution in a depth direction, and in (b) of an n"-th processing, each of a plurality of zones is controlled in a second temperature distribution, thereby forming the film having a second film thickness distribution in the depth direction, and wherein a variation in an opening dimension of the opening in the film thickness direction of the mask after (c) is smaller than a variation in an opening dimension of the opening in the film thickness direction of the mask before (c).

* * * * *